United States Patent
Ishibashi et al.

(10) Patent No.: US 8,178,983 B2
(45) Date of Patent: May 15, 2012

(54) WATER REPELLANT COMPOSITION FOR SUBSTRATE TO BE EXPOSED, METHOD FOR FORMING RESIST PATTERN, ELECTRONIC DEVICE PRODUCED BY THE FORMATION METHOD, TREATMENT METHOD FOR IMPARTING WATER REPELLENCY TO SUBSTRATE TO BE EXPOSED, WATER REPELLANT SET FOR SUBSTRATE TO BE EXPOSED, AND TREATMENT METHOD FOR IMPARTING WATER REPELLENCY TO SUBSTRATE TO BE EXPOSED USING THE SAME

(75) Inventors: Takeo Ishibashi, Hyogo (JP); Miwako Ishibashi, legal representative, Nagoya (JP); Mamoru Terai, Tokyo (JP); Takuya Hagiwara, Kawasaki (JP); Osamu Yokokoji, Kanagawa (JP); Yoko Takebe, Kanagawa (JP)

(73) Assignees: Renesas Electronics Corporation, Kanagawa (JP); Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 12/867,670

(22) PCT Filed: Feb. 20, 2009

(86) PCT No.: PCT/JP2009/053057
§ 371 (c)(1),
(2), (4) Date: Mar. 17, 2011

(87) PCT Pub. No.: WO2009/104748
PCT Pub. Date: Aug. 27, 2009

(65) Prior Publication Data
US 2011/0221077 A1 Sep. 15, 2011

(30) Foreign Application Priority Data

| Feb. 22, 2008 | (JP) | 2008-041716 |
| Jun. 20, 2008 | (JP) | 2008-161541 |
| Feb. 6, 2009 | (JP) | 2009-026327 |

(51) Int. Cl.
*H01L 23/29* (2006.01)
*B05D 3/02* (2006.01)
(52) U.S. Cl. ......... 257/788; 257/E23.116; 257/E23.117; 427/387; 427/393.4
(58) Field of Classification Search .......... 257/787–793, 257/E23.116, E23.117; 427/387, 393.4
See application file for complete search history.

(56) References Cited

U.S. PATENT DOCUMENTS

| 4,076,881 | A | * | 2/1978 | Sato | 428/195.1 |
| 5,238,708 | A | * | 8/1993 | Blizzard | 427/322 |
| 5,276,414 | A | * | 1/1994 | Fujimoto et al. | 333/246 |
| 5,990,212 | A | * | 11/1999 | Hager et al. | 524/269 |
| 6,696,225 | B1 | | 2/2004 | Kanbe et al. | |
| 2007/0190462 | A1 | | 8/2007 | Shiobara et al. | |

FOREIGN PATENT DOCUMENTS

| JP | 2000-033698 | | 2/2000 |
| JP | 2004-191386 | | 7/2004 |
| JP | 2005-118660 | A | 5/2005 |
| JP | 2006-066749 | | 3/2006 |
| JP | 2007-019465 | | 1/2007 |
| JP | 2007-194503 | | 8/2007 |

OTHER PUBLICATIONS

Japanese Office Action, with English translation, issued in Japanese Patent Application No. 2009-554402, dated Sep. 20, 2011.
International Preliminary Report on Patentability and Written Opinion of the International Searching Authority issued in International Patent Application No. PCT/JP2009/053057, mailed Oct. 14, 2010.

* cited by examiner

*Primary Examiner* — Jasmine Clark
(74) *Attorney, Agent, or Firm* — McDermott Will & Emery LLP

(57) ABSTRACT

It is an object of the present invention to provide a water repellant composition for a substrate to be exposed which inhibits the back side of a substrate to be exposed from being contaminated by an immersion liquid, can improve adhesion between a film to be processed and an organic film directly overlying that film to inhibit film peeling, and has excellent workability, a method for forming a resist pattern, an electronic device produced by the formation method, a treatment method for imparting water repellency to a substrate to be exposed, a water repellent set for a substrate to be exposed, and a treatment method for imparting water repellency to a substrate to be exposed using the same. A water repellent composition for a substrate to be exposed including at least an organosilicon compound represented by the following general formula (1) and a solvent is used.

In the formula, $R^1$ is a monovalent organic group having 14 to 30 carbon atoms, each $R^2$, $R^3$, and $R^4$ is independently a monovalent organic group or a hydrolyzable group having 1 to 10 carbon atoms, and at least one of $R^2$, $R^3$, and $R^4$ is a hydrolyzable group.

14 Claims, 10 Drawing Sheets

WATER REPELLANT COMPOSITION FOR SUBSTRATE TO BE EXPOSED, METHOD FOR FORMING RESIST PATTERN, ELECTRONIC DEVICE PRODUCED BY THE FORMATION METHOD, TREATMENT METHOD FOR IMPARTING WATER REPELLENCY TO SUBSTRATE TO BE EXPOSED, WATER REPELLANT SET FOR SUBSTRATE TO BE EXPOSED, AND TREATMENT METHOD FOR IMPARTING WATER REPELLENCY TO SUBSTRATE TO BE EXPOSED USING THE SAME

RELATED APPLICATIONS

This application is the U.S. National Phase under 35 U.S.C. §371 of International Application No. PCT/JP2009/053057, filed on Feb. 20, 2009, which in turn claims the benefit of Japanese Application No. 2008-041716, filed on Feb. 22, 2008, Japanese Application No. 2008-161541, filed on Jun. 20, 2008 and Japanese Application No. 2009-026327, filed on Feb. 6, 2009, the disclosures of which Applications are incorporated by reference herein.

BACKGROUND OF THE INVENTION

The present invention relates to a water repellent composition for a substrate to be exposed, a method for forming a resist pattern, an electronic device produced by the formation method, a treatment method for imparting water repellency to a substrate to be exposed, a water repellent set for a substrate to be exposed, and a treatment method for imparting water repellency to a substrate to be exposed using the same.

In recent years, among production processes of electronic devices (for example, semiconductor devices, liquid crystal display elements, magnetic heads, and microlenses), particularly in the production process of semiconductor devices, development of an immersion lithography process used for the production of the semiconductor device has been actively performed, the process includes performing exposure through the space between a projection optical system of an exposure device, and the substrate (including a semiconductor substrate and a wafer) to be exposed filled with an immersion liquid. As the immersion liquid, pure water is commonly used. However, in this process, there is a problem that the immersion liquid to be used in this exposure treatment flows into a back side through a periphery portion of the surface to be treated of the substrate to be exposed to contaminate the backside of the substrate to be exposed.

As a method for enhancing the water repellency of a wafer, a surface treatment using hexamethyldisilazane (HMDS) has been widely employed. However, the treatment by HMDS is not premised on the immersion lithography method and its water repellency is insufficient. For this situation, a method of using a silylation agent having a fluorine-substituted alkyl group or alkenyl group (Patent Document 1: JP-A No. 2007-019465), a method in which the treatment by HMDS is coated to a region within a specific area on a backside of a semiconductor substrate (Patent Document 2: JP-A No. 2007-194503) and the like are proposed.

However, in the method of Patent Document 1, there is a problem that a chemical solution, such as a resist, coated to the surface of a substrate is repelled by the surface and some locations where the chemical solution is not coated are generated, and in the method of Patent Document 2, there is a problem that water repellency is insufficient. Further, while an organic film such as a resist film is formed on a substrate on which a film to be processed has been formed for forming a resist pattern, the methods of Patent Documents 1 and 2 have a problem that an adhesive force between the film to be processed and the organic film directly overlying that film is insufficient, leading to peeling of the film from a wafer edge, and a foreign substance by film peeling is mixed with an immersion liquid due to the convection of the immersion liquid during immersion lithography to induce pattern defects. Furthermore, if the adhesive force between the film to be processed and the organic film directly overlying that film is insufficient, there is a problem that destruction of the resist pattern easily takes place. The destruction of the resist pattern means that an aspect ratio (that is, film thickness H/line width d) of the resist pattern increases as the resist pattern is microfabricated, an area of the contact of a substrate with the resist pattern becomes small, and therefore the resist patter is easily destructed.

SUMMARY OF THE INVENTION

In view of the above state of the art, it is an object of the present invention to provide a water repellant composition for a substrate to be exposed which inhibits the back side of a substrate to be exposed from being contaminated by an immersion liquid, can improve adhesion between a film to be processed and an organic film directly overlying that film to inhibit film peeling, and has excellent workability, a method for forming a resist pattern, an electronic device produced by the formation method, a treatment method for imparting water repellency to a substrate to be exposed, a water repellent set for a substrate to be exposed, and a treatment method for imparting water repellency to a substrate to be exposed using the same.

In order to solve the above-mentioned problems, the water repellent composition for a substrate to be exposed of the present invention includes at least an organosilicon compound represented by the following general formula (1) and a solvent.

(1)

In the formula, $R^1$ is a monovalent organic group having 14 to 30 carbon atoms, each $R^2$, $R^3$, and $R^4$ is independently a monovalent organic group or a hydrolyzable group having 1 to 10 carbon atoms, and at least one of $R^2$, $R^3$, and $R^4$ is a hydrolyzable group.

Further, the method for forming a resist pattern of the present invention is a method for forming a resist pattern by immersion lithography, the method includes performing exposure through a liquid interposed between a projection optical system of an exposure device and the substrate to be exposed, wherein a substrate treated with a water repellent composition for a substrate to be exposed including at least an organosilicon compound represented by the following general formula (1) and a solvent is exposed.

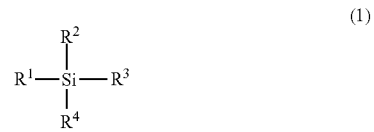

(1)

In the formula, $R^1$ is a monovalent organic group having 14 to 30 carbon atoms, each $R^2$, $R^3$, and $R^4$ is independently a monovalent organic group or a hydrolyzable group having 1 to 10 carbon atoms, and at least one of $R^2$, $R^3$, and $R^4$ is a hydrolyzable group.

Further, the electronic device of the present invention is produced by the above-mentioned method for forming a resist pattern.

Further, the treatment method for imparting water repellency to a substrate to be exposed of the present invention uses a water repellent composition including at least an organosilicon compound represented by the following general formula (1) and a solvent.

(1)

In the formula, $R^1$ is a monovalent organic group having 14 to 30 carbon atoms, each $R^2$, $R^3$, and $R^4$ is independently a monovalent organic group or a hydrolyzable group having 1 to 10 carbon atoms, and at least one of $R^2$, $R^3$, and $R^4$ is a hydrolyzable group.

In accordance with the present invention, the organosilicon compound represented by the general formula (1) is hydrolyzed to produce a silanol group, and the silanol group reacts with a hydroxyl group at the surface of a wafer and/or a film to be processed to form a chemical bond, and thereby it can impart high water repellency to the wafer or the film to be processed. This makes it possible to improve the water repellency of the wafer compared to a conventional treatment by HMDS. This makes it possible to effectively suppress the contamination of the backside of a substrate to be exposed by an immersion liquid in an immersion lithography method. Moreover, since the adhesion between a film to be processed for forming a resist pattern, which is formed beneath a resist film for microfabrication, and a resist film directly overlying that film can be improved, peeling of the film from a wafer edge can be suppressed. As a result of this, an adhesive force between the resist pattern and the substrate is enhanced, and therefore the destruction of the resist pattern can be inhibited, and an electronic device of high quality having no pattern defects can be provided. Since the composition of the present invention is a solution, a processing operation to a substrate is simple and water repellency can be selectively imparted by blowing the composition locally or the like. In addition, improvement in adhesion in the present invention refers to the improvement of the adhesion between the surface of the film to be processed, which is formed beneath the resist film for microfabrication, and the resist film directly overlying that film.

BRIEF DESCRIPTION OF THE DRAWINGS

FIG. 3A is an overall view and FIG. 3B is a partially enlarged view of an immersion shower head at the time of exposing a periphery portion of a substrate to be exposed.

FIG. 5A shows a process flow of the method and FIG. 5B is a schematic sectional view showing an example of a structure of an outer peripheral portion of a substrate to be exposed.

FIG. 6A shows a process flow of the method and FIG. 6B is a schematic sectional view showing an example of a structure of an outer peripheral portion of a substrate to be exposed.

FIG. 7A shows a process flow of the method and FIG. 7B is a schematic sectional view showing an example of a structure of an outer peripheral portion of a substrate to be exposed.

FIG. 8A shows a process flow of the method and FIG. 8B is a schematic sectional view showing an example of a structure of an outer peripheral portion of a substrate to be exposed.

FIG. 9A shows a process flow of the method and FIG. 9B is a schematic sectional view showing an example of a structure of an outer peripheral portion of a substrate to be exposed.

DETAILED DESCRIPTION OF THE PREFERRED EMBODIMENTS

Figure 1:
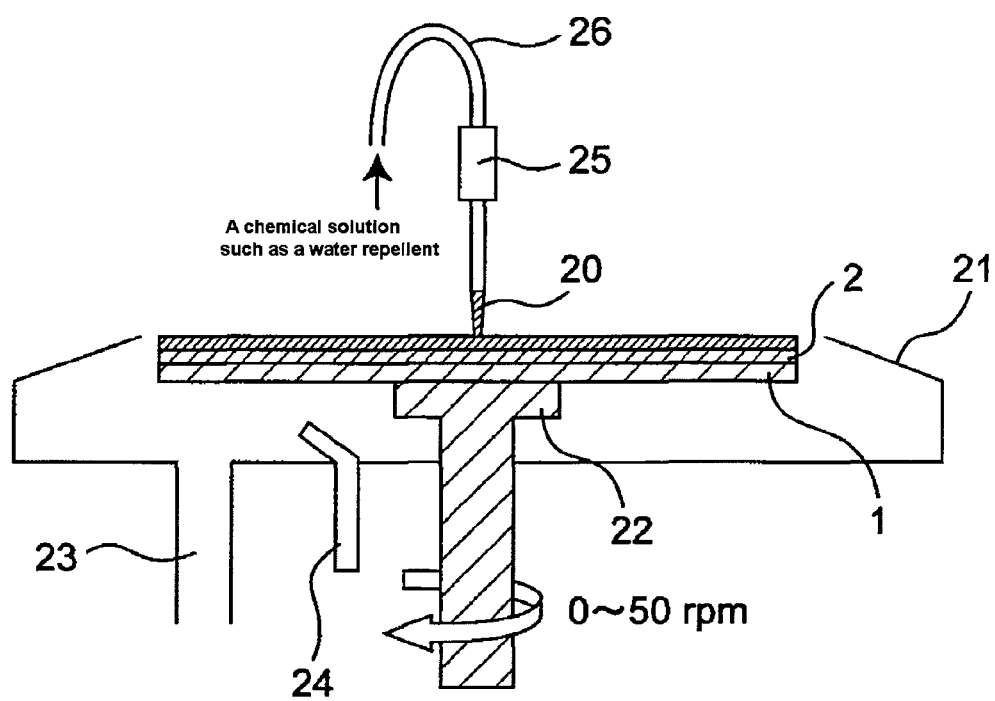
FIG. 1 is a schematic sectional view showing an aspect of a treatment for imparting water repellency in the method for forming a resist pattern of the present invention.

Hereinafter, embodiments of the present invention will be described with reference to drawings.

The water repellent composition for a substrate to be exposed of the present invention includes at least an organosilicon compound represented by the following general formula (1) and a solvent.

(1)

(Organosilicon Compound)

The organosilicon compound represented by the general formula (1) preferably does not have a fluorine atom. If the organosilicon compound has a fluorine atom, defects tend to be occurred in coating a resist onto a substrate to be processed after treatment for imparting water repellency to the substrate.

The matter that each $R^1$, $R^2$, $R^3$, and $R^4$ is an organic group means that a terminal atom, which couples with the silicon atom of the organic group is a carbon atom. A hydrolyzable group refers to a group or an atom which reacts with water to produce a hydroxyl group coupled with the silicon atom and refers to a group (alkoxy group, etc.) obtained by removing a hydrogen atom from the hydroxyl group of a hydroxy compound, an acyl group, an amino group, an aminoalkyl group, and a chlorine atom. A preferred group is the alkoxy group, and hereinafter, the organosilicon compound will be described, taking the alkoxy group as an example of the hydrolyzable group. Further, at least one of $R^2$, $R^3$, and $R^4$ is the hydrolyzable group, and preferably, two or three of $R^2$, $R^3$, and $R^4$ are the hydrolyzable groups, and particularly preferably, all of $R^2$, $R^3$, and $R^4$ are the hydrolyzable groups.

$R^1$ is a monovalent organic group having 14 to 30 carbon atoms. The monovalent organic group is preferably an organic group which does not contain a functional group to cause the reduction in water repellency and does not have a fluorine atom. As the organic group, a chain alkyl group is preferred. However, the organic group may have an ether oxygen atom between carbon atoms. The chain alkyl group may have a branch or may be straight-chain not having a branch, but the chain alkyl group is preferably straight-chain. The reason for this is that the straight chain alkyl group has more excellent water repellent performance. It is conceivable that a straight chain molecule forms a better water repellent surface. Furthermore, as the alkyl group, alkyl groups represented by $C_nH_{2n+1}$ are preferred. Here, n is an integer of 1 or more. The number of carbon atoms in $R^1$ is preferably 14 to 30, and more preferably 16 to 24. The reason for this is that when the number of carbon atoms is within this range, the coating property of the composition to a wafer is excellent.

Further, when each $R^2$, $R^3$, and $R^4$ is an organic group, this organic group is a monovalent organic group or a hydrolyzable group having 1 to 10 carbon atoms. It is preferred that at most one of $R^2$, $R^3$, and $R^4$ is an organic group, and examples of the organic group include aryl groups such as an alkyl group and a phenyl group. A more preferred organic group is an alkyl group having 1 to 5, furthermore preferably 1 to 3 carbon atoms. Examples of the alkyl groups include a methyl group, an ethyl group, a propyl group, a butyl group, a pentyl group, a hexyl group, an octyl group, and a decyl group, and a methyl group, an ethyl group, and a propyl group are preferred.

The hydrolyzable group which is suitable for achieving high water repellency is a group obtained by removing a hydrogen atom from the hydroxyl group of a hydroxy compound, and examples thereof include an alkoxy group, an alkoxy-substituted alkoxy group and an aryloxy group. The number of carbon atoms of the hydrolyzable group is preferably 10 or less. A more preferred hydrolyzable group is an alkoxy group or an alkoxy-substituted alkoxy group and the number of carbon atoms of these groups is preferably 5 or less and particularly more preferably 3 or less. The hydrolyzable group is hydrolyzed to produce a silanol group (a hydroxyl group coupled with a silicon atom), and the silanol group reacts with a hydroxyl group (—OH) at the surface of a substrate to be processed to form a siloxy bond (Si—O—Si), thereby exhibiting water repellency.

Examples of the group obtained by removing a hydrogen atom from the hydroxyl group of a hydroxy compound include alkoxy groups such as a methoxy group, an ethoxy group, a propoxy group and a butoxy group; alkoxy-substituted alkoxy groups such as a 2-methoxyethoxy group; and aryloxy groups such as a phenoxy group and a naphthoxy group. Among these groups, alkoxy groups having 5 or less carbon atoms are preferred and the methoxy group, the ethoxy group and the propoxy group are particularly preferred.

Specific examples of the organosilicon compound include $C_{16}H_{33}Si(OMe)_3$, $C_{18}H_{37}Si(OMe)_3$, $C_{20}H_{41}Si(OMe)_3$, $C_{24}H_{49}Si(OMe)_3$, $C_{18}H_{37}Si(OEt)_3$, $C_{18}H_{37}Si(OPr)_3$, $C_{18}H_{37}Si(OPh)_3$, $C_{18}H_{37}Si(OMe)(OEt)_2$, and $C_{18}H_{37}Si(Me)(OMe)_2$. These organosilicon compounds may be used alone or in combination of two or more species.

The composition of the present invention may contain a short chain organosilicon compound in addition to the organosilicon compound of the general formula (1). The surface having very high water repellency may repel a coating solution such as a resist composition. In such a case, coating property is deteriorated and adhesion is deteriorated. On the other hand, by using the organosilicon compound in combination with the short chain organosilicon compound, it is possible to secure the water repellency without deteriorating the adhesion. Here, the short chain organosilicon compound is an organosilicon compound in which in the general formula (1), $R^1$ is a monovalent organic group having 1 to 13 carbon atoms. The number of carbon atoms in $R^1$ in the short chain organosilicon compound is particularly preferably 6 to 12. In addition, as with the above-mentioned specific organosilicon compound, each $R^2$, $R^3$, and $R^4$ is independently a monovalent organic group or a hydrolyzable group having 1 to 10 carbon atoms, and at least one of $R^2$, $R^3$, and $R^4$ is a hydrolyzable group. The hydrolyzable group is preferably an alkoxy group. Further, preferably, two or three of $R^2$, $R^3$, and $R^4$ are the hydrolyzable groups, and particularly preferably, all of $R^2$, $R^3$, and $R^4$ are the hydrolyzable groups. As the short chain organosilicon compound, $C_{12}H_{25}Si(OMe)_3$ and $C_{10}H_{21}Si(OMe)_3$ are preferred.

In the present invention, when the organosilicon compound of the general formula (1) is used in combination with the short chain organosilicon compound, the ratio between both compounds is not particularly limited, and the molar ratio (organosilicon compound of general formula (1)/short chain organosilicon compound) is preferably 1/99 to 20/80, and particularly preferably 1/99 to 10/90. It is because when the proportion of the short chain organosilicon compound is more than 99 in the molar ratio, it becomes difficult to secure adequate water repellency, and when the proportion of the short chain organosilicon compound is less than 80 in the molar ratio, the adhesion is deteriorated.

(Solvent)

A solvent used for the composition of the present invention preferably has a boiling point of 70 to 200° C. at a pressure of 1 atmosphere. Furthermore preferably, the solvent has a boiling point of 100 to 150° C. The reason for this is that it is easy to coat the composition. As the solvent, an ether-based solvent, an ether alcohol-based solvent, an ether ester-based solvent, an alcohol-based solvent, an ester-based solvent, a ketone-based solvent and an amide-based solvent are preferred. The ether-based solvent, the ether alcohol-based solvent, the ether ester-based solvent, the alcohol-based solvent, and the ester-based solvent are more preferred since these solvents provide a chemically stable composition. Furthermore, these solvents have large solubility in the organosilicon compound and an acid which is an auxiliary described later, hardly become gel, and can be easily coated. Further, these solvents may be used alone or in combination of two or more species.

Examples of the ether-based solvent include 1,4-dioxane, bis(2-ethylhexyl)ether, diisoamyl ether, ethylene glycol dimethyl ether, and propylene glycol dimethyl ether.

Examples of the ether alcohol-based solvent include ethylene glycol monomethyl ether, ethylene glycol monobutyl ether, propylene glycol monomethyl ether, propylene glycol monoethyl ether, and propylene glycol monobutyl ether.

Examples of the ether ester-based solvent include propylene glycol monomethyl ether acetate, propylene glycol monomethyl ether propionate, propylene glycol monoethyl ether acetate, 2-ethoxyethyl acetate, carbitol acetate, methyl 3-methoxypropionate, ethyl 3-ethoxypropionate, and methyl β-methoxyisobutyrate.

Examples of the alcohol-based solvent include ethanol, 2-propanol, 1-butanol, 1-hexanol, 2-methyl-1-propanol, 4-methyl-2-pentanol, 2-octanol, and diacetone alcohol.

Examples of the ester-based solvent include ethyl acetate, isoamyl acetate, ethyl butyrate, propyl butyrate, methyl lactate, ethyl lactate, and γ-butyrolactone.

Examples of the ketone-based solvent include methyl isobutyl ketone, cyclohexanone, cyclopentanone, 2-heptanone, and N-methylpyrrolidone.

Examples of the amide-based solvent include N,N-dimethylformamide and N,N-dimethylacetoamide.

(Auxiliary)

The composition of the present invention can further include at least one auxiliary selected from the group consisting of an acid and salt thereof, a base and salt thereof, and an onium compound. Since this auxiliary is involved in a hydrolysis reaction of the organosilicon compound or a dehydration/condensation reaction with the wafer surface, it is possible to control the water repellent ability or adhesive ability of the composition by controlling the species or concentration of the auxiliary. It is preferred to use an acid, a salt thereof or a mixture thereof, or an onium compound, particularly an acid, a salt thereof or a mixture thereof, for the auxiliary. The reason for this is that these compounds can impart further chemical stability and water repellent ability to the composition. In addition, in the present invention, among salts, a compound having a structure of onium is distinguished from other salts as an onium compound.

The acid may be a free acid or may be a salt thereof. When the acid is a salt, the salt is preferably an onium salt or ammonium salt described later in order to reduce the contamination in a semiconductor production process. Further, the acid may be a mineral acid, or may be an organic acid. Examples of the mineral acid include hydrochloric acid, nitric acid, sulfuric acid, and phosphoric acid. Examples of the organic acid include carboxylic acid, sulfonic acid having an organic group, and phosphoric acid having an organic group. It is preferred to use the organic acid effective for reducing the contamination in a semiconductor production process.

As the acid, a carboxylic acid is particularly preferred. The reason for this is that the carboxylic acid has an excellent balance between the stability of the composition and the water repellency after coating. As the carboxylic acid, a carboxylic acid having 1 to 10 carbon atoms is preferred from the viewpoint of the solubility of the acid in the composition and the chemical stability of the composition. As the carboxylic acid, a monocarboxylic acid or dicarboxylic acid is preferred, and a monocarboxylic acid is more preferred from the viewpoint of the chemical stability of the composition. The number of carbon atoms in the carboxylic acid is 1 to 10, and more preferably 2 to 8. Examples of the carboxylic acid include a carboxylic acid not having a substituent group, a carboxylic acid substituted with a halogen atom, and a carboxylic acid substituted with a functional group such as a hydroxyl group. The carboxylic acid is preferably a monocarboxylic acid not having a substituent group, which is represented by the general formula $C_mH_{2m+1}COOH$ (m is an integer of 1 to 10, and its alkyl chain may have a branch).

Specific examples of the acid include acetic acid, propane acid, heptane acid, hexane acid, octane acid, 2-ethylhexanoic acid, lactic acid, trifluoroacetic acid, malonic acid, and maleic acid. These acids may be used alone or in combination of two or more species.

The base may be a free base or may be a salt thereof. When the base is a salt, the salt is preferably an onium salt described later in order to reduce the contamination in a semiconductor production process. The base is more preferably an organic base, and furthermore preferably an organic amine. Specific examples of the organic amine include primary amines such as methyl amine, ethyl amine, and aniline; secondary amines such as dimethyl amine and diethyl amine; and tertiary amines such as triethyl amine, triethanol amine, and pyridine.

The onium compound refers to an compound produced by coordinating a cationic reagent or the like to a lone electron pair in a compound containing an element having a lone electron pair such as nitrogen. As the onium compound, from the viewpoint of the stability of a semiconductor production process, an ammonium compound and a phosphonium compound are preferred, and more preferably an ammonium compound. The onium compound may be onium hydroxide, or may be an onium salt. The onium salt is preferably a salt of the acid mentioned above, and particularly preferably a carboxylic salt. Examples of the onium hydroxide include such as tetramethylammonium hydroxide.

Examples of only a cation portion of the onium salt suitable for using in the present invention include tetraalkylammonium ions such as tetramethylammonium ion, tetraethylammonium ion and tetrabutylammonium ion; and tetraalkylphosphonium ions such as tetramethylphosphonium ion, tetraethylphosphonium ion, and tetrabutylphosphonium ion.

Further, specific examples of the ammonium salt suitable for using in the present invention include ammonium formate, ammonium acetate, ammonium trifluoroacetate, ammonium sulfate and ammonium trifluoromethanesulfonate. The ammonium trifluoromethanesulfonate is particularly suitable in that the chemical stability of the composition is high. Further, by using ammonium trifluoromethanesulfonate, the organosilicon compound of the general formula (1) can be used at a low concentration, for example, a concentration of about 0.01% by mass lower than 0.1% by mass without deteriorating the water repellency or the adhesion of the composition.

The composition of the present invention includes at least the organosilicon compound and the solvent, and further includes the auxiliary as required. In order to suppress the hydrolysis of the organosilicon compound during storing, it is preferred to control a water content in the composition within the range of 10 to 30000 ppm of the whole composition. Further, a solvent in which a water content is 50 ppm or less by distillation or dehydration may be used as required.

Further, the proportion of the organosilicon compound in the composition is 0.01 to 6% by mass, preferably 0.1 to 5% by mass, and more preferably 0.5 to 3% by mass, taking the whole composition as 100% by mass. The reason for this is that if the proportion of the organosilicon compound is within this range, the organosilicon compound hardly becomes gel and the substrate is superior in water repellency.

Further, the proportion of the auxiliary in the composition is preferably 0.0001 to 0.5% by mass, and more preferably 0.001 to 0.2% by mass, taking the whole composition as 100% by mass. When the auxiliary is a free acid or a free base, the proportion of the auxiliary is preferably 0.01 to 0.5% by mass, and more preferably 0.01 to 0.2% by mass. Moreover, when the auxiliary is the onium compound, the proportion of the auxiliary is preferably 0.0001 to 0.05% by mass, and more preferably 0.003 to 0.01% by mass. When an ammonium salt is used as the auxiliary, the proportion of the auxiliary is preferably 0.0001 to 0.05% by mass, and more preferably 0.001 to 0.01% by mass.

Further, with respect to the proportion of the auxiliary to the organosilicon compound, the auxiliary is preferably 0.01 to 10 parts by mass and more preferably 0.01 to 5 parts by mass based on 1 part by mass of the organosilicon compound. The reason for this is that if the proportion is within this range, the composition is hardly gelated and is superior in water repellency. When the auxiliary is a free acid or a free base, the auxiliary is preferably 0.01 to 10 parts by mass and more preferably 0.01 to 5 parts by mass based on 1 part by mass of the organosilicon compound. When the auxiliary is an onium compound, the auxiliary is preferably 0.01 to 5 parts by mass and more preferably 0.01 to 1 part by mass based on 1 part by mass of the organosilicon compound.

In addition, the organosilicon compound and the auxiliary may be previously mixed and used (one liquid type), or may be mixed and used immediately before treating a wafer (two liquid type), but they are preferably mixed immediately before treating a wafer in order to secure storage stability. Further, when being used as two-component, the organosilicon compound represented by the general formula (1) and the auxiliary can be prepared separately, but it is preferred to use a water repellent set for a substrate to be exposed including an A solution containing at least the organosilicon compound represented by the general formula (1) and the solvent, and a B solution containing at least one auxiliary selected from the group consisting of an acid and salt thereof, a base and salt thereof, and an onium compound. Further, when the treatment for imparting water repellency to the substrate to be exposed is performed by use of the water repellent set for a substrate to be exposed, it is preferred to mix the A solution and the B solution so as to achieve a predetermined mixing ratio immediately before use, that is, immediately before treating a wafer. Here, a lapse of time between mixing and use is preferably 24 hours or less, more preferably 0 minute to 1.5 hours, and furthermore preferably 10 minutes to 1 hour.

Water may be added to the composition of the present invention as required in order to accelerate the hydrolysis reaction of the organosilicon compound.

Further, the composition of the present invention may include additives other than the above-mentioned auxiliaries within the range of not impairing the effect of the present invention. Examples of such additives include a surfactant, a leveling agent, and a silane coupling agent. As the silane coupling agent, a silane coupling agent having the same structure as in the general formula (1) except that $R^1$ is a functional group-containing organic group in the organosilicon compound represented by the general formula (1), or a silane coupling agent having the same structure as in the general formula (1) except that $R^1$ is a monovalent organic group having 1 to 13 carbon atoms in the organosilicon compound represented by the general formula (1) can be used. Here, examples of the functional group-containing organic group include an amino group, an ureido group, an epoxy group, a sulfide group, a vinyl group, an acryloyloxy group, a methacryloyloxy group, and a mercapto group. Examples of the monovalent organic group having 1 to 13 carbon atoms include organic groups which are the same as the organic group described in $R^1$ except for the number of carbon atoms in the organic group. $R^2$ to $R^4$ are the same as those in the general formula (1).

Examples of the surfactant include nonionic surfactants, anionic surfactants, cationic surfactants, and amphoteric surfactants, and further include silicone-based surfactants, polyalkylene oxide-based surfactants, and fluorine-containing surfactants.

Examples of the leveling agent include acrylic leveling agents, vinyl-based leveling agents, silicone-based leveling agents, and fluorine-based leveling agents.

The silane coupling agent is added for the purpose of further improving the adhesion and can be appropriately selected in accordance with the object. Examples of the functional group of the silane coupling agent include an amino group, an ureido group, an epoxy group, a sulfide group, a vinyl group, an acryloyloxy group, a methacryloyloxy group, and a mercapto group. In addition, the silane coupling agent can be used for both of the one-component and the two-component described above, and the silane coupling agent is preferably used for the two-component. In this case, the silane coupling agent may be previously added to a solution containing the organosilicon compound, or may be added in the process of mixing the solution containing the organosilicon compound with a solution containing the auxiliary.

(Method for Forming Resist Pattern)

The method for forming a resist pattern of the present invention is a method for forming a resist pattern by immersion lithography, which performs exposure through a liquid interposed between a projection optical system of an exposure device and a substrate, and includes the step of exposing a substrate to be exposed which has been treated with the water repellent composition containing at least an organosilicon compound represented by the general formula (1) and a solvent. For example, the method can be constituted by the step of forming a film to be processed on a wafer, the step of performing a treatment for imparting water repellency and for improving adhesion by use of the composition of the present invention, the step of coating a photosensitive resist layer for microfabrication, the step of coating a top coating layer for protecting the photosensitive resist layer, the step of performing immersion lithography, the step of developing the photosensitive resist, the step of etching the film, and the step of removing the residual film. Further, the photosensitive resist layer can be formed as a single layer or a multilayer resist layer. When the multilayer resist layer is formed, this layer can be constituted by three layers of at least a lower layer organic film layer, a silicon-containing intermediate layer and a photosensitive resist layer. Further, when the multilayer resist layer is formed, it is preferred to perform a treatment for imparting water repellency and for improving adhesion after the lower layer organic film layer and the silicon-containing intermediate layer are formed. The substrate to be processed (also referred to as merely substrate) in the present invention is a substrate to be treated with the water repellent composition in which a wafer is a main body and the photosensitive resist layer is not yet formed. The photosensitive resist layer is formed on a top surface of the substrate. Generally, the top surface of the substrate is composed of the surface of the film to be processed or the silicon-containing intermediate layer as described above, and the side of the substrate and the bottom surface of the substrate are composed of the surface of the wafer.

Here, in the present invention, the film to be processed for forming a resist pattern, which is formed beneath a resist film for microfabrication, includes polysilicon, a silicon oxide film, a silicon nitride film, an amorphous carbon film formed by the CVD process, a film on which an anti-reflection film, whose lower layer is an inorganic layer, is formed, and an inorganic film such as the silicon-containing intermediate layer in the mutilayer resist layer. In the method for forming a resist pattern of the present invention, a treatment for imparting water repellency and for improving adhesion is performed to a film to be processed including an inorganic film. This makes it possible not only to improve the water repellency of the wafer edge, but also to improve adhesion between a film to be processed and a resist film for microfabrication.

(Treatment for Imparting Water Repellency and for Improving Adhesion)

A treatment for imparting water repellency and for improving adhesion (hereinafter, referred to as treatment for imparting water repellency) can be performed by coating the composition of the present invention onto a side of the substrate, a periphery portion of the top surface of the substrate and/or a periphery portion of the bottom surface of the substrate. Alternatively, the treatment can be performed by coating the composition of the present invention onto a side of the substrate, a whole area of the top surface of the substrate and a periphery portion of the bottom surface of the substrate. By the treatment for imparting water repellency using the composition of the present invention, it is possible to achieve a contact angle of water with a wafer of 75° or more, more preferably 90° or more. Further, by the treatment for imparting water repellency to a whole area of the top surface, adhesion between a film to be processed and a resist film for microfabrication directly overlying that film can be further improved.

FIG. 1 shows an example in which the treatment for imparting water repellency to a whole area of the top surface of the substrate. An coating apparatus has an coating cup 21 accommodating a substrate having a film 2 to be processed on the upper face of a wafer 1, and a spin chuck which is rotatably supported at the center of the coating cup 21, and holds the substrate. A chemical solution such as a water repellent supplied from a feeding pipe 26 is discharged from a tip of a surface nozzle 25 which is movable in the horizontal direction and the vertical direction to the film 2 to be processed on the substrate. An extra chemical solution spilled over from the substrate is drained out of an effluent outlet located at a bottom of the coating cup 21. This configuration allows the composition of the present invention to be puddled to form a liquid film, thereby the treatment for imparting water repellency to a whole area of the top surface of the substrate is performed. In this case, the basic rotational speed of the substrate is stop (0 rpm), and it is possible to provide a fluctuation of 50 rpm at several second intervals to stir the solution. In addition, in this case, since the chemical solution is spilled over from the substrate, the treatment for imparting water repellency can be simultaneously performed to a side of the substrate.

Figure 2:
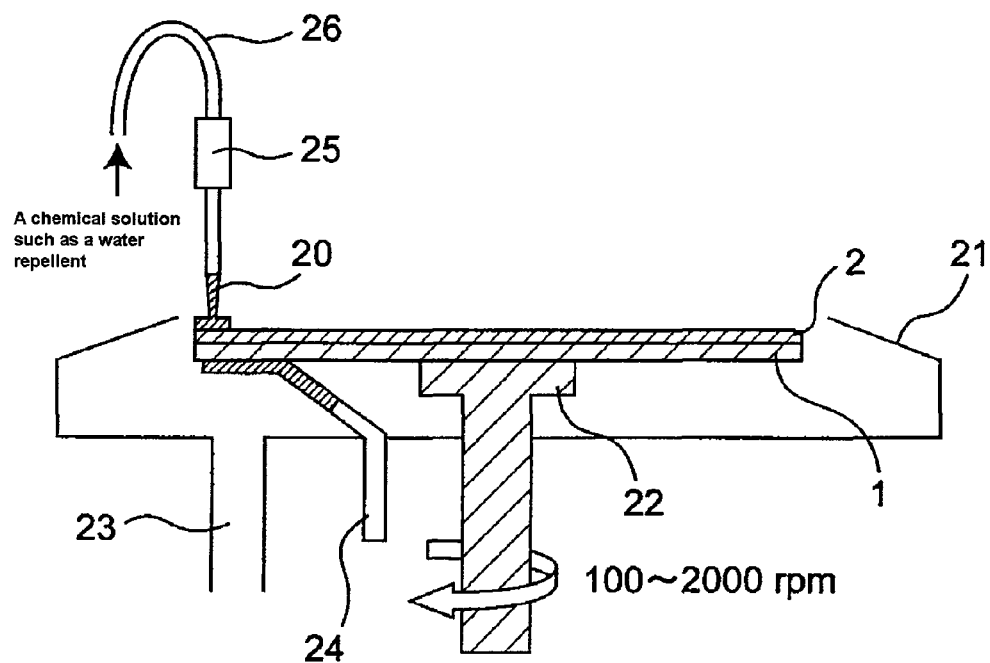
FIG. 2 is a schematic sectional view showing another aspect of a treatment for imparting water repellency in the method for forming a resist pattern of the present invention.

However, in the case where the treatment is performed to the whole area of the substrate, the water repellency is imparted to an area to be patterned of the resist film for microfabrication, which is coated in a subsequent step, and therefore adverse effects on coating performance, development performance and multilayered process dry development performance may be concerned. In such a case, an area to which the treatment for imparting water repellency is locally performed to a side of the substrate, a periphery portion of the top surface of the substrate and a periphery portion of the bottom surface of the substrate (hereinafter, these are also collectively referred to as "outer peripheral portion"), excluding an area to be patterned. As this method, for example, a method in which, as shown in FIG. 2, a surface nozzle 25 is moved to an outer peripheral portion of the substrate and the outer peripheral portion of the substrate is locally treated can be employed. Specifically, a method of selectively treating only the periphery portion of the top surface of the substrate with composition of the present invention while rotating the substrate at a rotational speed of about 100 to 2000 rpm can be employed. At this time, the width of a region treated for imparting water repellency of the periphery portion can be adjusted to a width of about 0.3 to 3.0 mm from the substrate edge by controlling the position of the nozzle with high accuracy using a stepping motor.

The treatment for imparting water repellency to the periphery portion of the bottom surface of the substrate can also be performed by blowing the composition of the present invention from with backside by use of a backside nozzle shown in FIG. 2. By imparting water repellency to the bottom surface, it is possible to eliminate an influence of foreign substances on the stage of an exposure device resulting from flowing of an immersion liquid into the bottom surface during immersion lithography. The region which needs to perform the treatment for imparting water repellency is an area to generate a force of lifting water by a capillary force and the outermost surface where the surface of the substrate edge is a non-horizontal portion. The location affected most is a side portion (a bevel portion) of the substrate, which is close to an outer peripheral frame of the stage, and it is desirable to impart the water repellency to the non-horizontal portion of the coated film on the inner side of the bevel portion. Accordingly, a central part of the substrate does not need to be imparted with the water repellency and the water repellency may be imparted to a predetermined region in the outer peripheral portion of the substrate.

FIG. 1 shows an example of using a surface nozzle and FIG. 2 shows an example of using a surface nozzle and a backside nozzle, and it is also possible to impart the water repellency to the bevel portion by using only the backside nozzle. That is, by controlling the position of the backside nozzle in FIG. 2, the flow rate of a chemical solution and the rotational speed at the time of draining the chemical solution, a small amount of the solution flows from the backside to the upper surface of a wafer periphery portion, and thereby a bottom surface, the upper surface of a periphery portion and a bevel portion can be imparted with the water repellency. Particularly, since it is also possible to impart the water repellency locally to only the upper surface and side surface of the bevel portion, it is possible to suppress coating property deterioration brought with a result of a repelling of a coating solution itself such as a resist due to enlargement of a surface treated for imparting water repellency. Further, since the contact area of a water repellent surface with the immersion liquid can be minimized, a contamination risk can be reduced.

Further, when the treatment for imparting water repellency locally by limiting to an outer peripheral portion of the substrate excluding an area to be patterned, film formation on a surface not imparted with the water repellency and edge cutting along a surface imparted with the water repellency can be simultaneously performed by utilizing liquid-repelling property of the surface imparted with the water repellency in forming a film of a coating solution such as a resist after the treatment for imparting water repellency (hereinafter, referred to as self-alignment edge cutting). This makes it possible to eliminate the need for separately performing the step of edge cutting using a thinner for dissolving a coating film such as a resist. Further, there may be cases where because of departure of an operational range of a device or the like, a wafer is rarely fixed to a position deviated by several µm from the center of the wafer (referred to decentering) to perform spin coating. Even though a film is formed in the state of decentering, edge cutting can be exactly performed along the surface treated for imparting water repellency by self-alignment edge cutting. If decentering occurs in the case of usual edge cutting, a portion treated for imparting water repellency is deviated from an edge cutting portion and the surface not treated for imparting water repellency may be exposed to the surface of the substrate. If immersion lithography is performed in this state, there is a possibility to induce many defects of resist pattern. With respect to the presence or absence of occurrence of liquid-repelling by the treatment for imparting water repellency, the liquid-repelling tends to occur when the water repellency after the treatment for imparting water repellency is high, but this occurrence varies depending on the combination of a water repellent to be used and a solvent constituting a coating solution such as a resist. For example, when the organosilicon compound ($C_{18}H_{37}Si(OMe)_3$) is used as a water repellent and propylene glycol monomethyl ether acetate (PGMEA) is used as a solvent for a coating solution, the liquid-repelling tends to occur in the case where the contact angle is 90° or more. In addition, the cutting width of the self-alignment edge cutting varies according to the rotational speed of coating a coating solution such as a resist, and if the width of the surface treated for imparting water repellency is taken as X μm, the cutting width is about (X−10) μm to (X−500)μm. A coating film of 10 to 500 μm is formed directly on the surface treated for imparting water repellency, and the adhesion of this portion is retained by using the composition and the treatment method for imparting water repellency of the present invention.

Figure 3A:
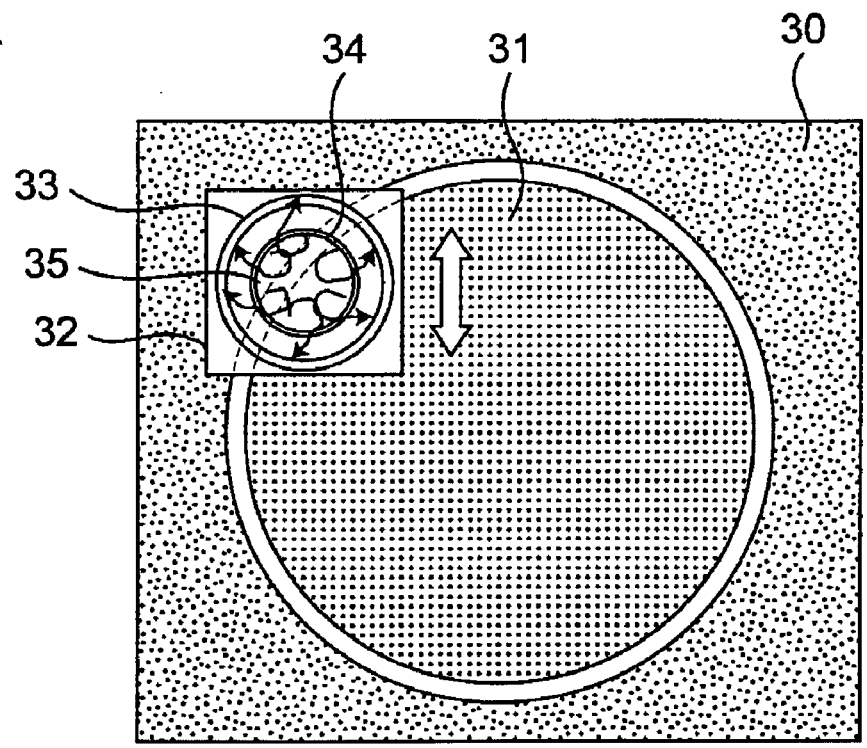
FIG. 3A, 3B is an example of a plan view of an immersion type lithography apparatus used in the method for forming a resist pattern of the present invention.
Figure 3B:
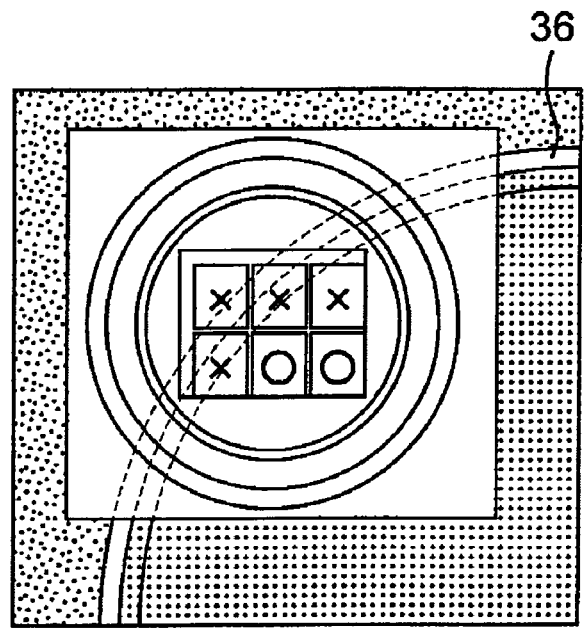

Hereinafter, a method for determining a region treated for imparting water repellency will be described by use of a plan view of an immersion type lithography device. FIG. 3A is a plan view of an immersion type lithography apparatus. An immersion shower head 32 is scanned in the direction of an arrow on a substrate 31 to be exposed placed on a stage 30. A lens 35 is installed in the immersion shower head 32, and pure water enters form a water flow inlet 34 and is discharged from a water suction opening 33. FIG. 3B is a partially enlarged view of the immersion shower head 32 at the time of exposing a periphery portion of the substrate 31 to be exposed. Two tips of a symbol ○ can be used as an operational tip, but four tips of a symbol x in which a water film is protruded out of a wafer are rejected as a defected shot. Further, numeral 36 represents a gap between the substrate 31 to be exposed and an outer peripheral frame of the stage 30, and the immersion liquid spilled over from this gap contaminates the backside of the substrate to be exposed and the exposure device.

Since the treatment for imparting water repellency is performed using the nozzle shown in FIG. 1 or FIG. 2, the minimum value of the region treated for imparting water repellency can be determined depending on positioning accuracy (about 0.2 to 0.3 mm) of the nozzle. Further, the maximum value can be set at a value to an extent that the number of effective tips (symbol of ○) in an edge exposure shot is not reduced as seen in the partially enlarged view of the substrate edge to be exposed in FIG. 3B. Generally, the width of removed edge of a resist may reach about 3.0 mm because of various process situations, and in this case, even if a width up to 3 mm is treated for imparting water repellency, product yield is not affected. Therefore, the maximum removal width in the case where the nozzle is used can be utilized as a value to an extent that the number of effective tips is not reduced.

As a reaction of the water repellent with the substrate, it is preferred to select the case where a reaction occurs at room temperature, but in the case of the water repellent with poor reactivity, after the solution is brought into contact with the surface, the substrate may be subjected to heat treatment at a temperature of 60 to 180° C. for about 1 minute with a hot plate.

EXAMPLES

The present invention will be described more detail by way of the following examples.
(Preparation of Composition)

Organosilicon compounds, acids and solvents, shown in Table 1, were mixed in the proportions shown in Table 1. The concentration is a concentration (unit: % by mass) at the time of taking the amount of the whole composition as 100% by mass. A substance other than the organosilicon compound and the acid is a solvent. However, the amount of water to be added described in the table is the proportion (unit: % by mass) of water added in forming a composition by adding the predetermined amount of water. Further, the mixing ratio of the organosilicon compound in the table represents a molar ratio.

Further, the water content in the table is a water content (unit: %) obtained by measuring a mixture of a solvent and an acid in the same proportions as those of compositions in the table and the so-called water content brought in. Further, the water content was measured using a Karl Fischer moisture titrator (MKC-500) made by Kyoto Electronics Manufacturing Co., Ltd. About 0.3 ml (separately weighed) of the mixture sample of the solvent and the acid was used and the water content was measured according to a coulometric titration method.

Abbreviations for solvents or the like are as follows.
PGME: propylene glycol monomethyl ether
PGMEA: propylene glycol monomethyl ether acetate
IPA: 2-propanol
HMDS: hexamethyldisilazane
TMAH: tetramethylammonium hydroxide
TMAA: tetramethylammonium acetate salt
TFAA: trifluoroacetic acid
AA: ammonium acetate
AF: ammonium formate
ATS: ammonium trifluoromethanesulfonate However, in the case of TMAH, an aqueous solution having a TMAH content of 2.38% by mass was used and the concentration in the aqueous solution was described as a concentration. Further, numeral values on the right side of abbreviations for solvents represent a mixing ratio (ratio by mass). After mixing, the resulting mixture was filtered with a PTFE filter with a nominal opening of 0.5 μm to prepare Compositions 1 to 43 and Comparative Compositions 2 to 7.

TABLE 1

| Composition | Organosilicon compound | Concentration | Auxiliary | Concentration | Amount of water to be added | Water content | Solvent |
|---|---|---|---|---|---|---|---|
| 1 | $C_{18}H_{37}Si(OMe)_3$ | 1.3 | acetic acid | 0.2 | — | — | PGME/PGMEA (7/3) |
| 2 | $C_{16}H_{33}Si(OMe)_3$ | 1.3 | acetic acid | 0.2 | — | — | PGME/PGMEA (7/3) |
| 3 | $C_{16}H_{37}Si(OMe)_3$ | 1.3 | — | — | — | 0.17 | PGME/PGMEA (7/3) |
| 4 | $C_{16}H_{37}Si(OMe)_3$ | 1.3 | lactic acid | 0.2 | — | — | PGME/PGMEA (7/3) |

TABLE 1-continued

| Composition | Organosilicon compound | Concentration | Auxiliary | Concentration | Amount of water to be added | Water content | Solvent |
|---|---|---|---|---|---|---|---|
| 5 | C$_{18}$H$_{37}$Si(OMe)$_3$ | 1.3 | TFAA | 0.2 | — | — | PGME/PGMEA (7/3) |
| 6 | C$_{18}$H$_{37}$Si(OMe)$_3$ | 1.3 | hexanoic acid | 0.2 | — | — | PGME/PGMEA (7/3) |
| 7 | C$_{18}$H$_{37}$Si(OMe)$_3$ | 1.3 | — | — | — | 0.17 | PGME |
| 8 | C$_{18}$H$_{37}$Si(OMe)$_3$ | 1.3 | acetic acid | 0.2 | — | — | PGMEA |
| 9 | C$_{18}$H$_{37}$Si(OMe)$_3$ | 1.3 | hexanoic acid | 0.2 | — | — | PGMEA |
| 10 | C$_{18}$H$_{37}$Si(OMe)$_3$ | 1.3 | acetic acid | 0.025 | — | — | PGMEA |
| 11 | C$_{18}$H$_{37}$Si(OMe)$_3$ | 1.3 | acetic acid | 0.1 | — | 0.19 | PGMEA |
| 12 | C$_{18}$H$_{37}$Si(OMe)$_3$ | 1.3 | acetic acid | 0.25 | — | — | PGMEA |
| 13 | C$_{18}$H$_{37}$Si(OMe)$_3$ | 1.3 | acetic acid | 2 | — | 0.29 | PGMEA |
| 14 | C$_{18}$H$_{37}$Si(OMe)$_3$ | 1.3 | acetic acid | 10 | — | — | PGMEA |
| 15 | C$_{18}$H$_{37}$Si(OMe)$_3$ | 0.65 | acetic acid | 0.05 | — | — | PGMEA |
| 16 | C$_{18}$H$_{37}$Si(OMe)$_3$ | 2.5 | acetic acid | 0.2 | — | — | PGMEA |
| 17 | C$_{18}$H$_{37}$Si(OMe)$_3$ | 4 | acetic acid | 0.32 | — | — | PGMEA |
| 18 | C$_{18}$H$_{37}$Si(OMe)$_3$ | 5 | acetic acid | 0.4 | — | — | PGMEA |
| 19 | C$_{18}$H$_{37}$Si(OMe)$_3$ | 1.3 | acetic acid | 0.24 | 1.5 | — | PGMEA |
| 20 | C$_{18}$H$_{37}$Si(OMe)$_3$ | 1.3 | TMAH acetic acid | 0.2 0.2 | — | — | PGMEA |
| 21 | C$_{18}$H$_{37}$Si(OMe)$_3$ | 1.3 | TMAH acetic acid | 0.02 0.2 | — | — | PGMEA |
| 22 | C$_{18}$H$_{37}$Si(OMe)$_3$ | 1.3 | TMAH acetic acid | 0.002 0.2 | — | — | PGMEA |
| 23 | C$_{18}$H$_{37}$Si(OMe)$_3$ | 1.3 | TMAH | 0.2 | — | — | PGMEA |
| 24 | C$_{18}$H$_{37}$Si(OMe)$_3$ | 1.3 | TMAH | 0.03 | — | — | PGMEA |
| 25 | C$_{18}$H$_{37}$Si(OMe)$_3$ | 1.3 | TMAA | 0.002 | 0.098 | — | PGMEA |
| 26 | C$_{18}$H$_{37}$Si(OMe)$_3$ | 1.3 | AA acetic acid | 0.002 0.2 | 0.098 | — | PGMEA |
| 27 | C$_{18}$H$_{37}$Si(OMe)$_3$ | 1.3 | AF acetic acid | 0.002 0.2 | 0.098 | — | PGMEA |
| 28 | C$_{18}$H$_{37}$Si(OMe)$_3$ | 1.3 | ATS acetic acid | 0.002 0.2 | 0.098 | — | PGMEA |
| 29 | C$_{18}$H$_{37}$Si(OMe)$_3$ C$_{10}$H$_{21}$Si(OMe)$_3$ (5/95) | 1.3 | ATS acetic acid | 0.002 0.2 | 0.098 | — | PGMEA |
| 30 | C$_{18}$H$_{37}$Si(OMe)$_3$ C$_{10}$H$_{21}$Si(OMe)$_3$ (2/98) | 1.3 | ATS acetic acid | 0.002 0.2 | 0.098 | — | PGMEA |
| 31 | C$_{18}$H$_{37}$Si(OMe)$_3$ C$_{10}$H$_{21}$Si(OMe)$_3$ (1/99) | 1.3 | ATS acetic acid | 0.002 0.2 | 0.098 | — | PGMEA |
| 32 | C$_{18}$H$_{37}$Si(OMe)$_3$ | 1.3 | ATS | 0.002 | 0.098 | — | PGMEA |
| 33 | C$_{18}$H$_{37}$Si(OMe)$_3$ C$_{10}$H$_{21}$Si(OMe)$_3$ (2/98) | 1.3 | ATS | 0.002 | 0.098 | — | PGMEA |
| 34 | C$_{18}$H$_{37}$Si(OMe)$_3$ C$_{10}$H$_{21}$Si(OMe)$_3$ (0.5/99.5) | 1.3 | ATS acetic acid | 0.002 0.2 | 0.098 | — | PGMEA |
| 35 | C$_{18}$H$_{37}$Si(OMe)$_3$ C$_{10}$H$_{21}$Si(OMe)$_3$ (0.25/99.75) | 1.3 | ATS acetic acid | 0.002 0.2 | 0.098 | — | PGMEA |

TABLE 2

| Composition | Organosilicon compound | Concentration | Auxiliary | Concentration | Amount of water to be added | Water content | Solvent |
|---|---|---|---|---|---|---|---|
| 36 | C$_{18}$H$_{37}$Si(OMe)$_3$ | 0.065 | ATS | 0.002 | 0.098 | — | PGMEA |
| 37 | C$_{18}$H$_{37}$Si(OMe)$_3$ | 0.13 | ATS | 0.002 | 0.098 | — | PGMEA |
| 38 | C$_{18}$H$_{37}$Si(OMe)$_3$ | 0.26 | ATS | 0.002 | 0.098 | — | PGMEA |
| 39 | C$_{18}$H$_{37}$Si(OMe)$_3$ | 0.65 | ATS | 0.002 | 0.098 | — | PGMEA |
| 40 | C$_{18}$H$_{37}$Si(OMe)$_3$ | 1.3 | ATS | 0.002 | 0.098 | — | cyclohexanone |
| 41 | C$_{18}$H$_{37}$Si(OMe)$_3$ | 1.3 | ATS | 0.002 | 0.098 | — | PGME |
| 42 | C$_{18}$H$_{37}$Si(OMe)$_3$ | 1.3 | ATS | 0.002 | 0.098 | — | IPA |
| 43 | C$_{18}$H$_{37}$Si(OMe)$_3$ | 1.3 | ATS | 0.002 | 0.098 | — | isoamyl ether |
| Comparison 1 | HMDS | — | — | — | — | — | — |
| Comparison 2 | C$_4$F$_9$CH$_2$CH$_2$Si(OMe)$_3$ | 1.3 | acetic acid | 0.1 | — | — | PGME/PGMEA (7/3) |
| Comparison 3 | CF$_3$CH$_2$CH$_2$Si(OMe)$_3$ | 1.3 | acetic acid | 0.1 | — | — | PGMEA |
| Comparison 4 | C$_{12}$H$_{25}$Si(OMe)$_3$ | 1.3 | acetic acid | 0.2 | — | — | PGME/PGMEA (7/3) |
| Comparison 5 | C$_{10}$H$_{21}$Si(OMe)$_3$ | 1.3 | acetic acid | 0.2 | — | — | PGME/PGMEA (7/3) |

TABLE 2-continued

| Composition | Organosilicon compound | Concentration | Auxiliary | Concentration | Amount of water to be added | Water content | Solvent |
|---|---|---|---|---|---|---|---|
| Comparison 6 | $C_6H_{11}Si(OMe)_3$ | 1.3 | acetic acid | 0.2 | — | — | PGME/PGMEA (7/3) |
| Comparison 7 | $C_{10}H_{21}Si(OMe)_3$ | 1.3 | ATS acetic acid | 0.002 0.2 | 0.098 | — | PGMEA |

Measurement of Water Repellency

Experimental Examples 1 to 33

The water repellency was evaluated using Compositions 1 to 9 and 19 to 35, and Comparative Compositions 1 to 7. A contact angle (unit: degree), a sliding angle (unit: degree), and a receding contact angle (unit: degree) were measured as the evaluation of the water repellency with use of a contact angle meter DM-700 made by Kyowa Interface Science Co., Ltd. With respect to the volume of a droplet used, in the case of a measurement of the contact angle the volume was 2 μL, and in the case of a measurement of the sliding angle and the receding contact angle the volume were 50 μL, respectively.

The treatment method is as follows. About 0.25 mL of the composition was coated onto a silicon wafer cut into a size of 4 centimeters square. The composition was coated for 30 seconds at a rotational speed of 300 rpm and for 60 seconds at a rotational speed of 3000 rpm by spin coating. The resulting silicon wafer was baked for 60 seconds using a hot plate at 150° C.

By the above process, a substrate whose surface was treated was obtained.

Further, in the HMDS treatment of Comparison 1, a substrate obtained by leaving a silicon wafer standing at 90° C. for 40 seconds in an atmosphere of HMDS to treat the wafer was used.

When the composition of the present invention was employed, a contact angle of 75° or more could be achieved. Further, with respect to the sliding angle and the receding contact angle, a smaller sliding angle and a larger receding contact angle are respectively preferred.

TABLE 3

| Experimental Example | Composition | Contact angle | Sliding angle | Receding contact angle |
|---|---|---|---|---|
| 1 | 1 | 99 | 11 | 91 |
| 2 | 2 | 97 | 16 | 86 |
| 3 | 3 | 97 | 10 | 91 |
| 4 | 4 | 89 | 19 | 78 |
| 5 | 5 | 75 | 22 | 58 |
| 6 | 6 | 100 | 9 | 90 |
| 7 | 7 | 75 | 22 | 54 |
| 8 | 8 | 98 | 10 | 92 |
| 9 | 9 | 100 | 9 | 89 |
| 10 | 19 | 99 | 10 | 91 |
| 11 | 20 | 100 | 17 | 90 |
| 12 | 21 | 100 | 11 | 93 |
| 13 | 22 | 102 | 12 | 94 |
| 14 | 23 | 94 | 16 | 84 |
| 15 | 24 | 95 | 14 | 87 |
| 16 | 25 | 103 | 10 | 94 |
| 17 | 26 | 86 | 18 | 72 |
| 18 | 27 | 94 | 14 | 84 |
| 19 | 28 | 106 | 11 | 96 |
| 20 | 29 | 98 | 12 | 87 |
| 21 | 30 | 86 | 15 | 76 |
| 22 | 31 | 78 | 20 | 67 |
| 23 | 32 | 106 | 12 | 95 |
| 24 | 33 | 87 | 19 | 72 |
| 25 | 34 | 71 | — | — |
| 26 | 35 | 60 | — | — |
| 27 | Comparison 1 | 62 | — | 52 |
| 28 | Comparison 2 | 66 | 18 | 60 |
| 29 | Comparison 3 | 67 | 14 | 62 |
| 30 | Comparison 4 | 63 | — | — |
| 31 | Comparison 5 | 24 | — | — |
| 32 | Comparison 6 | 38 | — | — |
| 33 | Comparison 7 | 49 | — | — |

Figure 10:
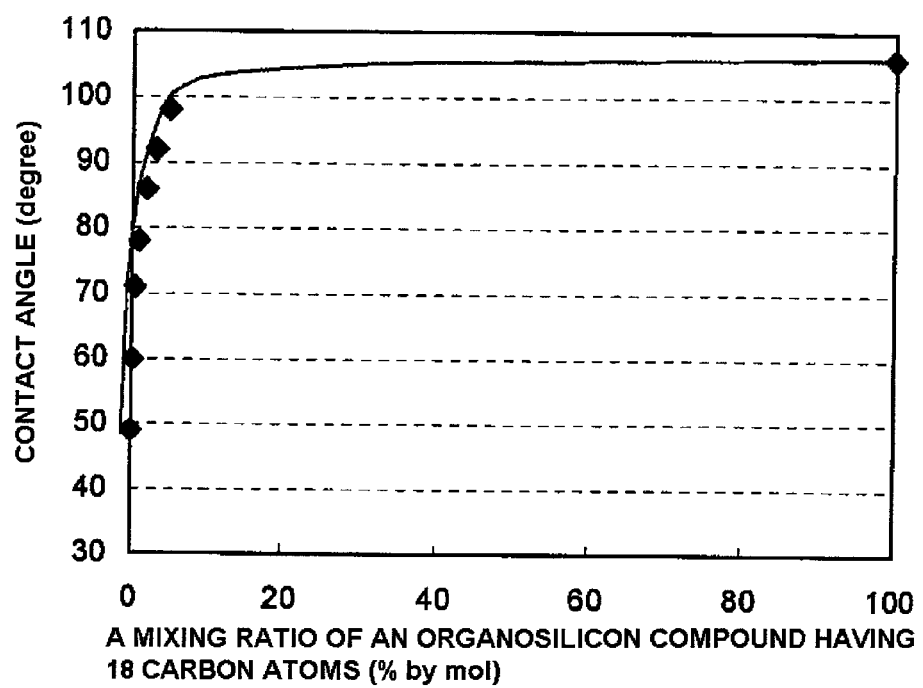
FIG. 10 is a graph showing a relationship between a mixing ratio of an organosilicon compound of the general formula (1) to a short chain organosilicon compound and a contact angle in the case where the short chain organosilicon compound is used in addition to the organosilicon compound of the general formula (1) in the present invention.

A relationship between a mixing ratio (% by mol) of $C_{18}H_{37}Si(OMe)_3$ to $C_{10}H_{21}Si(OMe)_3$ and the contact angle in the case where $C_{18}H_{37}Si(OMe)_3$ is used in combination with $C_{10}H_{21}Si(OMe)_3$ is shown in FIG. 10. When $C_{10}H_{21}Si(OMe)_3$ is singly used, the contact angle was 49°, but the contact angle sharply increases as the proportion of $C_{18}H_{37}Si(OMe)_3$ increases, and it reaches 98° when the proportion of $C_{18}H_{37}Si(OMe)_3$ is 5% by mol and slightly increases for the proportion of 5% by mol or more.

Stability Evaluation 1

Experimental Examples 34 to 42

The influence of the amount of acid to be added on storage stability was verified. The influences of Compositions 10 to 14, 26 to 27, 32 to 33 were evaluated visually and in terms of the contact angle. Liquids immediately after preparing the compositions were colorless and clear. Thereafter, the liquids were stored at room temperature for 9 days and then their stabilities were checked. When the stability was deteriorated, gelation occurred and the liquid became cloudy. The liquid having become cloudy was indicated by "cloudy" in the table. Further, contact angle measurements were made on the composition revealing no abnormality visually. The numeral values in the table represent a contact angle. The contact angle measurements were performed in the same manner as in Experimental Examples 1 to 33. Compositions 32 to 33 were not found to be cloudy even after a lapse of 21 days and there was little change in the contact angle.

TABLE 4

| | | Contact angle/result of visual observation | | | | |
|---|---|---|---|---|---|---|
| Experimental Example | Composition | Immediately after | After one day | After two days | After five days | After nine days |
| 34 | 10 | 92 | 95 | 93 | 92 | 95 |
| 35 | 11 | 98 | 100 | 99 | 96 | 99 |
| 36 | 12 | 103 | 102 | 102 | 97 | 100 |
| 37 | 13 | 102 | 102 | 102 | 104 | cloudy |

TABLE 4-continued

| | | Contact angle/result of visual observation | | | | |
|---|---|---|---|---|---|---|
| Experimental Example | Composition | Immediately after | After one day | After two days | After five days | After nine days |
| 38 | 14 | 100 | 104 | cloudy | — | — |
| 39 | 26 | 86 | cloudy | — | — | — |
| 40 | 27 | 94 | 96 | 96 | cloudy | — |
| 41 | 32 | 106 | 107 | 107 | 107 | 107 |
| 42 | 33 | 87 | 89 | 89 | 89 | 89 |

Influence of Organosilicon Compound Concentration

Experimental Examples 43 to 46

The influence of an organosilicon compound concentration was checked. Compositions 15 to 18 were used. The contact angle, the sliding angle and the receding contact angle were measured in the same manner as in Experimental Examples 1 to 33.

TABLE 5

| Experimental Example | Composition | Contact angle | Sliding angle | Receding contact angle |
|---|---|---|---|---|
| 43 | 15 | 101 | 10 | 95 |
| 44 | 16 | 102 | 10 | 93 |
| 45 | 17 | 79 | 18 | 77 |
| 46 | 18 | 81 | 4 | 77 |

Stability Evaluation 2

Experimental Example 47

The influence of the time lapsed from composition preparation until composition coating on the water repellency was verified. The stability of Composition 11 was evaluated in terms of the contact angle of a sample coated after the lapse of a predetermined time. The numeral values in the table represent contact angles. The contact angle measurements were performed in the same manner as in Experimental Examples 1 to 33.

TABLE 6

| | | Contact angle | | | |
|---|---|---|---|---|---|
| Experimental Example | Composition | Immediately after preparation | After three hours | After six hours | After one day |
| 47 | 11 | 98 | 98 | 100 | 100 |

Upper Portion Coating Property Evaluation 1

Experimental Examples 48 and 49

By following the same procedure as in Experimental Examples 1 to 33, a wafer treated for imparting water repellency, in which the surface of a silicon wafer cut into a size of 4 centimeters square was treated with each of Composition 11 and Comparative Composition 2, was obtained. Next, ARC 29, a 2nd minimum organic arc produced by Nissan Chemical Industries Co., Ltd., as a bottom antireflective coating (BARC), a chemically amplified resist photosensitive to ARF, and a top coat for immersion were respectively coated by spin coating onto the wafer treated for imparting water repellency, and then the resulting wafer was baked for 60 seconds using a hot plate at 150° C. The coating property on the substrate whose surface was treated by the above-mentioned procedures was visually checked. The evaluation of coating property in the table was performed based on the presence or absence and the degree of locations (defects) where coating cannot be performed. That is, A in the table represents that there was no defect and good coating property was exhibited, B represents that coating defects were recognized in a portion of the substrate whose surface was treated, and C represents that defects were produced almost over the whole area of the substrate whose surface was treated and the composition could not be coated uniformly.

TABLE 7

| | | Upper portion applicability | | |
|---|---|---|---|---|
| Experimental Example | Composition | Bottom antireflective coating | Resist | Top coat |
| 48 | 11 | A | A | A |
| 49 | Comparison 2 | C | C | C |

Adhesion Evaluation

Experimental Examples 50 and 51

Figure 4:
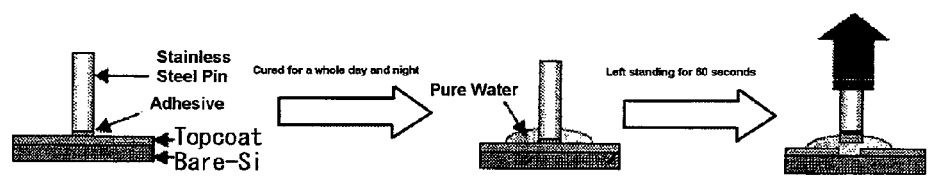
FIG. 4 is a schematic view showing a method for evaluating adhesion in the present invention.

By following the same procedure as in Experimental Examples 1 to 33, a wafer treated for imparting water repellency, in which the surface of a silicon wafer cut into a size of 4 centimeters square was treated with each of Composition 11 and HMDS, was obtained. Next, a top coat for immersion was coated by spin coating onto the wafer treated for imparting water repellency, and then the resulting wafer was baked for 60 seconds using a hot plate at 110° C. A stainless steel (SUS 304) pin of 3 mm in diameter was adhered to the surface of a top coat of the treated silicon wafer with a cyanoacrylic adhesive (trade name: Aron Alpha, made by Toagosei Co., Ltd.), and a curing reaction was allowed to proceed for a whole day and night. Thereafter, as shown in FIG. 4, the silicon wafer was fixed to the SUS pin using an adhesive and cured for a whole day and night. Thereafter, pure water was blown on the adhesive portion and left standing for 60 seconds, and then the SUS pin was pulled up vertically to measure the adhesion between the silicon wafer and the top coat. The results of the measurement are shown in Table 8, but it was verified that the adhesive strength of Composition 11 is about eight times larger than that of HMDS (Comparison 1).

TABLE 8

| Experimental Example | Composition | Adhesive strength (N/mm$^2$) |
|---|---|---|
| 50 | 11 | 11.7 |
| 51 | Comparison 1 | 1.5 |

Influence of Baking Temperature

Experimental Examples 52 to 59

By following the same procedure as in Experimental Examples 1 to 33, Composition 32 and Composition 37 were coated by spin coating onto the surface of a silicon wafer cut into a size of 4 centimeters square. Changing the temperature of a hot plate, each resulting silicon wafer was baked for 60 seconds. The contact angle, the sliding angle and the receding contact angle were measured in the same manner as in Experimental Examples 1 to 33.

TABLE 9

| Experimental Example | Composition | Baking temperature | Contact angle | Sliding angle | Receding contact angle |
|---|---|---|---|---|---|
| 52 | 32 | 90° C. | 86 | 10 | 72 |
| 53 | 32 | 110° C. | 85 | 13 | 81 |
| 54 | 32 | 130° C. | 108 | 10 | 100 |
| 55 | 32 | 150° C. | 105 | 9 | 97 |
| 56 | 37 | 90° C. | 100 | 16 | 86 |
| 57 | 37 | 110° C. | 104 | 7 | 99 |
| 58 | 37 | 130° C. | 101 | 10 | 94 |
| 59 | 37 | 150° C. | 101 | 9 | 94 |

Influence of Organosilicon Compound Concentration

Experimental Examples 60 to 64

By following the same procedure as in Experimental Examples 1 to 33, Compositions 32 and 36 to 39 were coated by spin coating onto the surface of a silicon wafer cut into a size of 4 centimeters square. Each resulting silicon wafer was baked at 110° C. for 60 seconds. The contact angle, the sliding angle and the receding contact angle were measured in the same manner as in Experimental Examples 1 to 33. It is believed that when the concentration of the organosilicon compound is reduced, a structure like a monomolecular film, which is suitable for exerting the water repellency at the surface, is formed. Further, it is believed that when the concentration is increased, appropriate water repellency is exhibited since the organosilicon compound is laminated but the degree of oligomerization increases through condensation between the organosilicon compounds by heating, or laminated excessive organosilicon compound volatilizes and a water repellent group appears on the surface.

TABLE 10

| Experimental Example | Composition | Contact angle | Sliding angle | Receding contact angle |
|---|---|---|---|---|
| 60 | 32 | 85 | 13 | 81 |
| 61 | 36 | 97 | 17 | 81 |
| 62 | 37 | 104 | 7 | 99 |
| 63 | 38 | 107 | 7 | 100 |
| 64 | 39 | 107 | 10 | 100 |

Influence of Solvent

Experimental Examples 65 to 69

By following the same procedure as in Experimental Examples 1 to 33, Compositions 32 and 40 to 43 were coated by spin coating onto the surface of a silicon wafer cut into a size of 4 centimeters square. Each resulting silicon wafer was baked at 110° C. for 60 seconds. The contact angle was measured in the same manner as in Experimental Examples 1 to 33.

TABLE 11

| Experimental Example | Composition | Contact angle |
|---|---|---|
| 65 | 32 | 85 |
| 66 | 40 | 97 |
| 67 | 41 | 88 |
| 68 | 42 | 106 |
| 69 | 43 | 81 |

Example 1

Figure 5A:
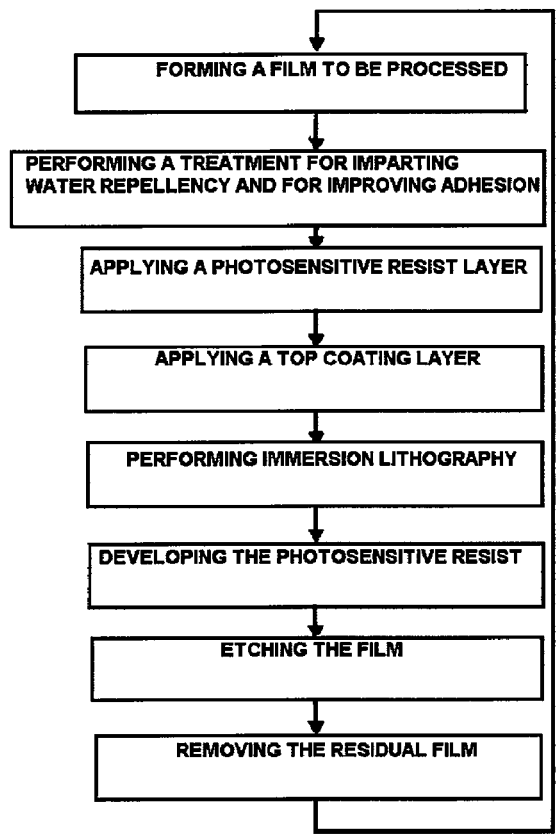
FIG. 5A, 5B shows an example of the method for forming a resist pattern of the present invention.
Figure 5B:
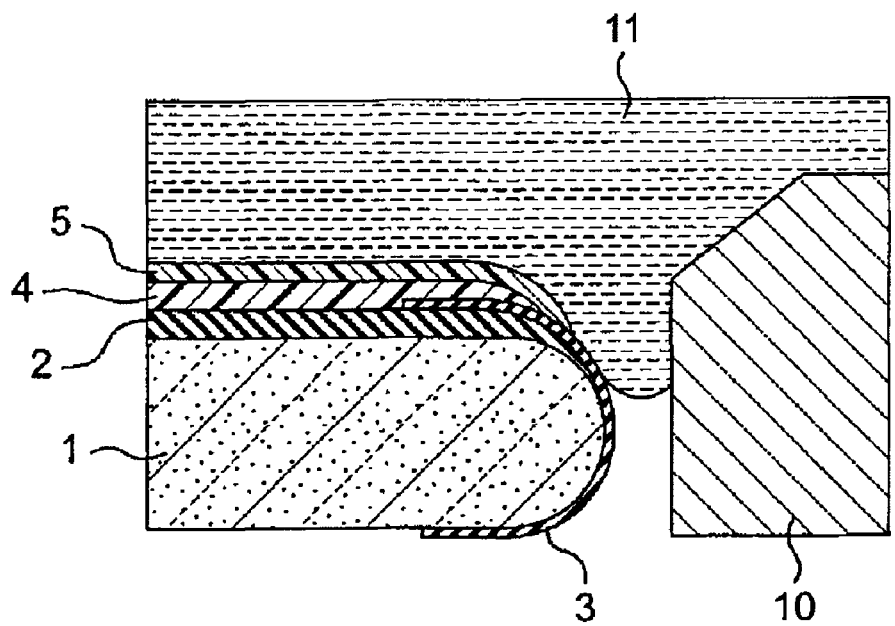

Using Composition 11 shown in Table 1, a semiconductor device was produced by following the process flow shown in FIG. 5A. FIG. 5B is an example of a structure of an outer peripheral portion of a substrate to be exposed after a treatment for imparting water repellency and shows a state at the time of immersion lithography.

First, a film 2 to be processed was formed on a wafer 1, and then by the method shown in FIG. 2, Composition 11 was respectively sprayed onto a top surface side by a surface nozzle and onto a bottom surface side by a backside nozzle during rotating at 300 to 2000 rpm. Thereby, a layer 3 treated for imparting water repellency was formed at a periphery portion of the top surface of the substrate, a side of the substrate and a periphery portion of the bottom surface of the substrate. Here, when it was difficult to complete a reaction at room temperature, the wafer was transferred from a spinner cup and the substrate was heated at 150° C. for 60 seconds on a hot plate. In addition, by optimizing a time duration during which Composition 11 was sprayed from a nozzle and the rotational speed of the substrate, the amount of Composition 11 to be adsorbed could be controlled and the water repellency and the adhesive strength could be adjusted.

Thereafter, a methacrylate-based ArF chemically amplified positive resist (film thickness 100 to 200 nm) was coated by spin coating and the resulting substrate was baked at 105° C. for 60 seconds to form a photosensitive resist layer 4. Next, a coating solution for top coat was coated thereon by spin coating and then the resulting substrate was baked at 110° C. for 60 seconds to form a top coating layer 5.

The resulting substrate to be exposed was subjected to exposure treatment with an immersion lithography device, and consequently, as shown in FIG. 5B, there was no spill over of an immersion liquid 11 between a stage 10 and the substrate to be exposed and peeling of the edge portion of the substrate to be exposed due to convection of the immersion liquid 11 was not recognized. Thereafter, the substrate was developed with a 2.38% by mass of an aqueous tetramethylammonium hydroxide solution to complete pattern formation. Using this resist film as a mask, the film to be processed was plasma dry etched. The film to be processed was etched with respect to polysilicon in the step of forming a transistor. In any case, the resist and the lower layer organic film layer were removed by $O_2$ plasma ashing and a wet treatment using sulfuric acid and a hydrogen peroxide solution after the completion of etching. In this case, it was verified that the layer treated for imparting water repellency, which had been previously formed, was peeled off. Next, a silicon oxide film in a contact step was formed and the surface of the silicon oxide film was used as an irradiated surface and the procedure of this example was repeated to complete pattern formation of the contact step. Similarly, the procedures of a metal step and a via step were repeated to complete a semiconductor device.

Example 2

Figure 6A:
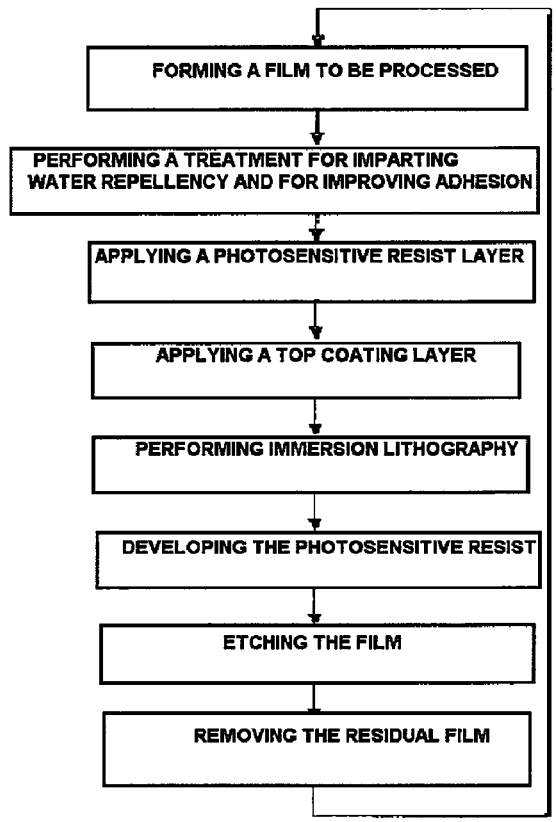
FIG. 6A, 6B shows an example of the method for forming a resist pattern of the present invention.
Figure 6B:
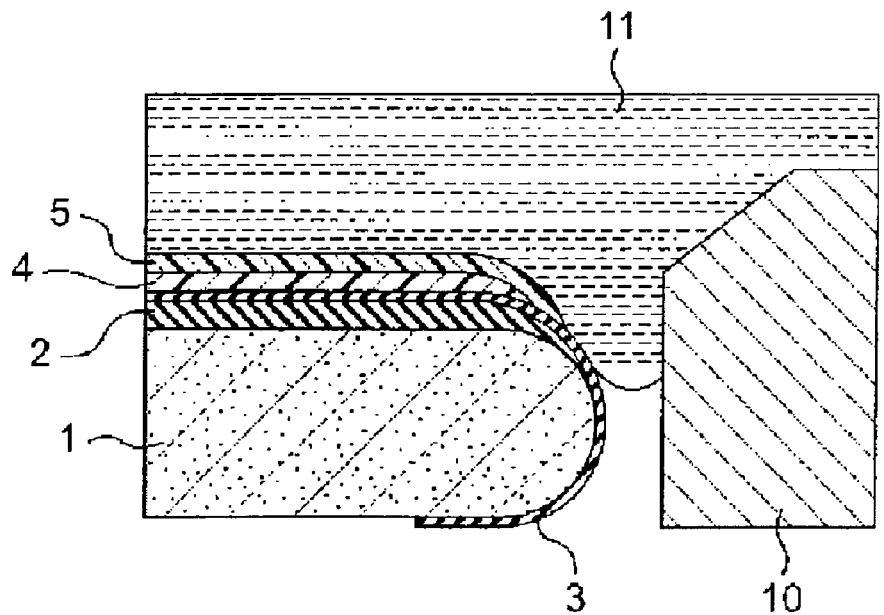

In this example, using Composition 11 shown in Table 1, a semiconductor device was produced by following the process flow shown in FIG. 6A. FIG. 6B is an example of a structure of an outer peripheral portion of a substrate to be exposed after a treatment for imparting water repellency and shows a state at the time of immersion lithography.

In the method shown in FIG. 2, a treatment for imparting water repellency was performed in the same manner as in Example 1 except for moving the surface nozzle to spray Composition 11 over a whole area of a top surface of the substrate. Thereby, a layer 3 treated for imparting water repellency was formed on a whole area of the top surface of the substrate, and at a side of the substrate and at a periphery portion of the bottom surface of the substrate.

Thereafter, a photosensitive resist layer 4 was formed in the same manner as in Example 1. Next, a coating solution for top coat was coated thereon by spin coating and then the resulting substrate was baked at 110° C. for 60 seconds to form a top coating layer 5.

The resulting substrate to be exposed was subjected to exposure treatment with an immersion lithography device, and consequently, as shown in FIG. 6B, there was no spill over of an immersion liquid 11 between a stage 10 and the substrate to be exposed and peeling of the edge portion of the substrate to be exposed due to convection of the immersion liquid 11 was not recognized. Thereafter, the substrate was developed with a 2.38% by mass of an aqueous tetramethylammonium hydroxide solution to complete pattern formation. Using this resist film as a mask, the film to be processed was plasma dry etched. The film to be processed was etched with respect to polysilicon in the step of forming a transistor. In any case, the resist and the lower layer organic film layer were removed by $O_2$ plasma ashing and a wet treatment using sulfuric acid and a hydrogen peroxide solution after the completion of etching. In this case, it was verified that the layer treated for imparting water repellency, which had been previously formed, was peeled off. Next, a silicon oxide film in a contact step was formed and the surface of the silicon oxide film was used as an irradiated surface and the procedure of this example was repeated to complete pattern formation of the contact step. Similarly, the procedures of a metal step and a via step were repeated to complete a semiconductor device. In addition, in this example, since the treatment for imparting water repellency to a whole area of the top surface of the substrate, adhesion between the film to be processed and the photosensitive resist layer can be further improved, and thereby the destruction of the resist pattern can be further suppressed.

Example 3

Figure 7A:
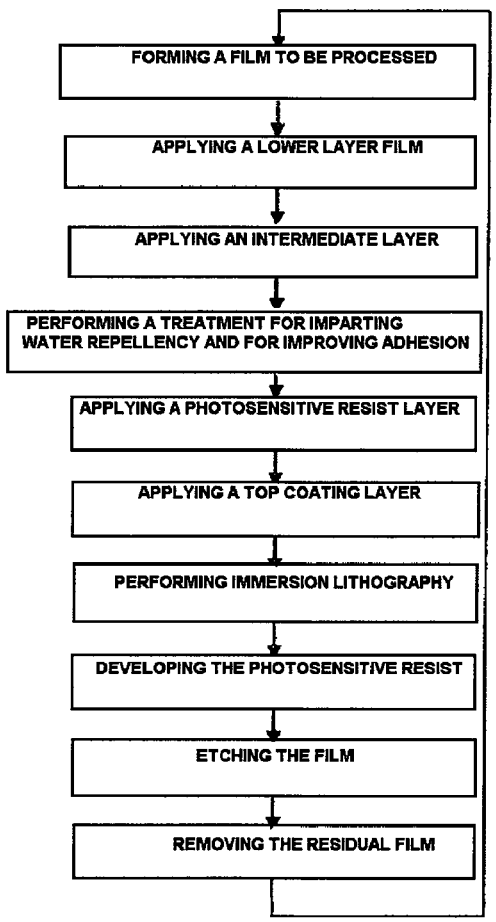
FIG. 7A, 7B shows an example of the method for forming a resist pattern of the present invention.
Figure 7B:
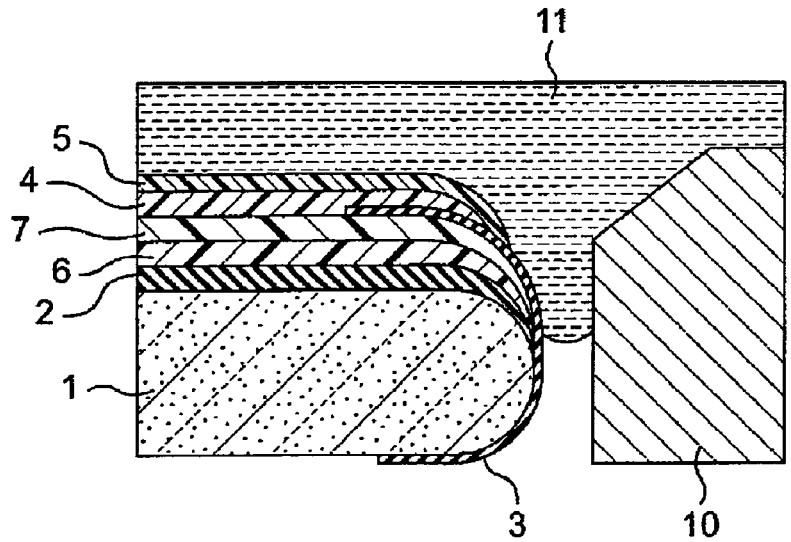

In this example, using Composition 11 shown in Table 1, a semiconductor device was produced by following the process flow shown in FIG. 7A. FIG. 7B is an example of a structure of an outer peripheral portion of a substrate to be exposed after a treatment for imparting water repellency and shows a state at the time of immersion lithography.

First, a film 2 to be processed was formed on a wafer 1, and then a coating solution for a lower layer organic film was coated in a film thickness of about 150 to 300 nm, and the coated coating solution was cured by heating at 200 to 250° C. for about 1 to 1.5 minutes to evaporate the solvent adequately and to perform cross linking of polymers through a reaction of a thermal reaction active site to form a lower layer organic film layer 6. Thereafter, a silsesquioxane-based polymer derivative such as inorganic SOG or organic SOG was coated in a film thickness of about 80 nm by spin coating, and the coated derivative was dehydrated and condensed by heat treatment at 200 to 250° C. for about 1 to 1.5 minutes, or was cross-linked by reacting a reaction-active site such as an epoxy functional group to form a silicon-containing intermediate layer 7.

Next, in the method shown in FIG. 2, a treatment for imparting water repellency was performed in the same manner as in Example 1 except for changing the rotational speed to 1000 rpm. Thereby, a layer 3 treated for imparting water repellency were formed at a periphery portion of the top surface of the substrate, a side of the substrate and a periphery portion of the bottom surface of the substrate.

Thereafter, a photosensitive resist layer 4 was formed in the same manner as in Example 1. Next, a coating solution for top coat was coated thereon by spin coating and then the resulting substrate was baked at 110° C. for 60 seconds to form a top coating layer 5.

The resulting substrate to be exposed was subjected to exposure treatment with an immersion lithography device, and consequently, as shown in FIG. 7B, there was no spill over of an immersion liquid 11 between a stage 10 and the substrate to be exposed and peeling of the edge portion of the substrate to be exposed due to convection of the immersion liquid 11 was not recognized. Thereafter, the substrate was developed with a 2.38% by mass of an aqueous tetramethylammonium hydroxide solution to complete pattern formation. Using this resist film as a mask, the film to be processed was plasma dry etched. The film to be processed was etched with respect to polysilicon in the step of forming a transistor. In any case, the resist and the lower layer organic film layer were removed by $O_2$ plasma ashing and a wet treatment using sulfuric acid and a hydrogen peroxide solution after the completion of etching. In this case, it was verified that the layer treated for imparting water repellency, which had been previously formed, was peeled off. Next, a silicon oxide film in a contact step was formed and the surface of the silicon oxide film was used as an irradiated surface and the procedure of this example was repeated to complete pattern formation of the contact step. Similarly, the procedures of a metal step and a via step were repeated to complete a semiconductor device.

Example 4

Figure 8A:
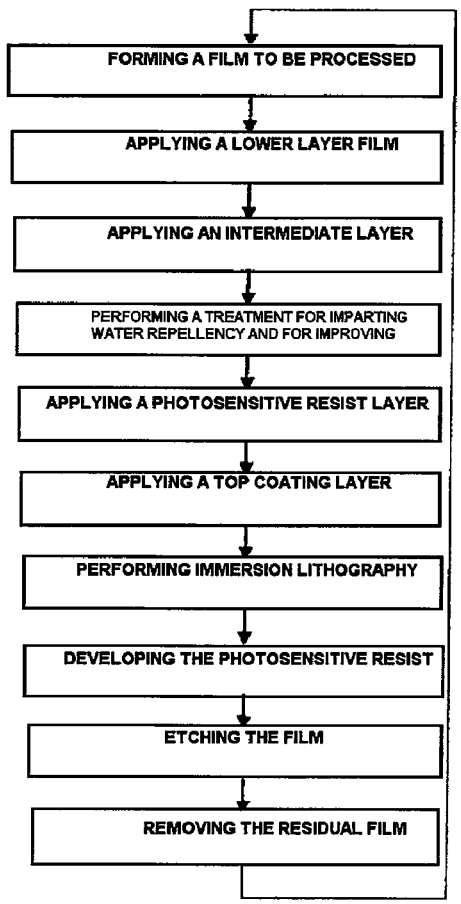
FIG. 8A, 8B shows an example of the method for forming a resist pattern of the present invention.
Figure 8B:
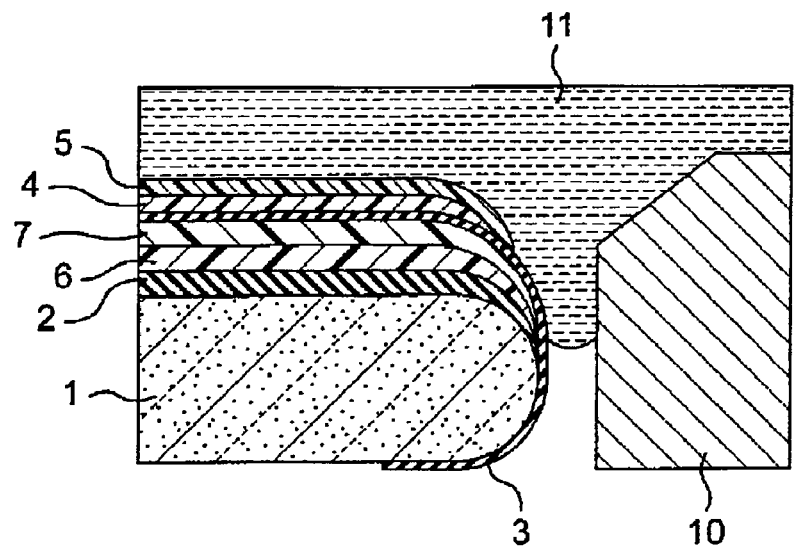

In this example, using Composition 11 shown in Table 1, a semiconductor device was produced by following the process flow shown in FIG. 8A. FIG. 8B is an example of a structure of an outer peripheral portion of a substrate to be exposed after a treatment for imparting water repellency and shows a state at the time of immersion lithography.

First, a film 2 to be processed was formed on a wafer 1, then a lower layer organic film layer 6 and a silicon-containing intermediate layer 7 were formed in the same manner as in Example 3.

Next, a treatment for imparting the water repellency was performed in the same manner as in Example 2. Thereby, a layer 3 treated for imparting water repellency were formed on a whole area of the top surface of the substrate, and at a side of the substrate and at a periphery portion of the bottom surface of the substrate.

Thereafter, a photosensitive resist layer 4 was formed in the same manner as in Example 1. Next, a coating solution for top coat was coated thereon by spin coating and then the resulting substrate was baked at 110° C. for 60 seconds to form a top coating layer 5.

The resulting substrate to be exposed was subjected to exposure treatment with an immersion lithography device, and consequently, as shown in FIG. 8B, there was no spill over of an immersion liquid 11 between a stage 10 and the substrate to be exposed and peeling of the edge portion of the substrate to be exposed due to convection of the immersion liquid 11 was not recognized. Thereafter, the substrate was developed with a 2.38% by mass of an aqueous tetramethylammonium hydroxide solution to complete pattern formation. Using this resist film as a mask, the film to be processed was plasma dry etched. The film to be processed was etched with respect to polysilicon in the step of forming a transistor. In any case, the resist and the lower layer organic film layer were removed by $O_2$ plasma ashing and a wet treatment using sulfuric acid and a hydrogen peroxide solution after the completion of etching. In this case, it was verified that the layer treated for imparting water repellency, which had been previously formed, was peeled off. Next, a silicon oxide film in a contact step was formed and the surface of the silicon oxide film was used as an irradiated surface and the procedure of this example was repeated to complete pattern formation of the contact step. Similarly, the procedures of a metal step and a via step were repeated to complete a semiconductor device. In addition, in this example, since the treatment for imparting water repellency to a whole area of the top surface of the substrate, adhesion between the film to be processed and the photosensitive resist layer can be further improved, and thereby the destruction of the resist pattern can be further suppressed.

Example 5

Figure 9A:
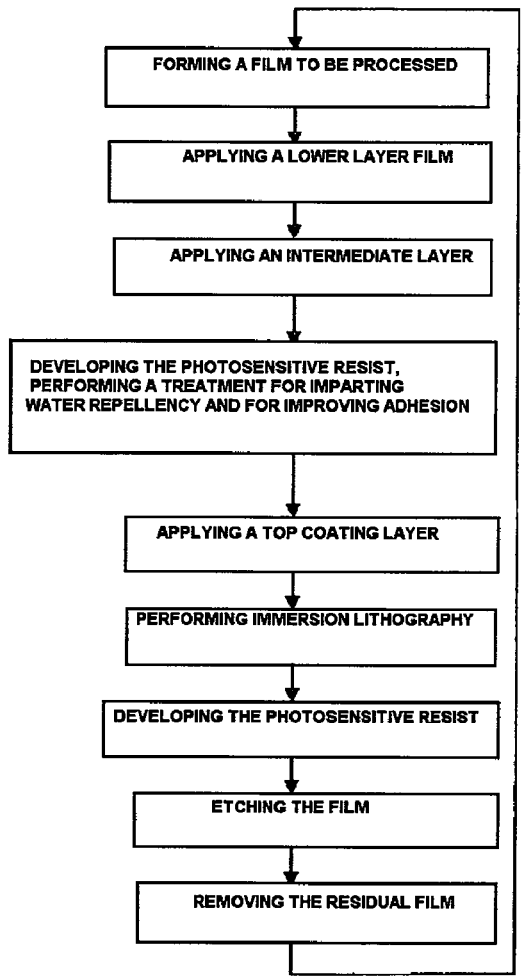
FIG. 9A, 9B shows an example of the method for forming a resist pattern of the present invention.
Figure 9B:
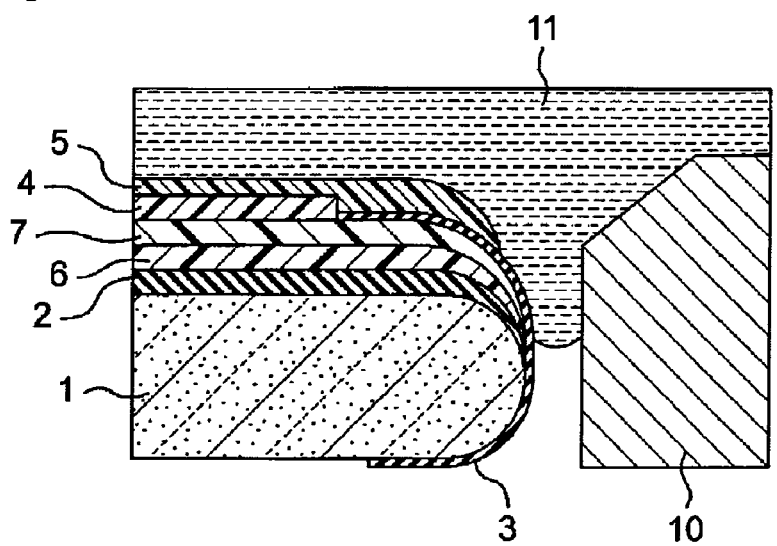

Using Composition 11 shown in Table 1, a semiconductor device was produced by following the process flow shown in FIG. 9A. FIG. 9B is an example of a structure of an outer peripheral portion of a substrate to be exposed after a treatment for imparting water repellency and shows a state at the time of immersion lithography.

First, a film 2 to be processed was formed on a wafer 1, then a lower layer organic film layer 6 and a silicon-containing intermediate layer 7 were formed in the same manner as in Example 3, and a methacrylate-based ArF chemically amplified positive resist (film thickness 100 to 200 nm) was coated by spin coating.

Thereafter, by the method shown in FIG. 2, Composition 11 was respectively sprayed onto a top surface side by a surface nozzle and onto a bottom surface side by a backside nozzle during rotating at 300 to 2000 rpm. Thereby, the step of forming a layer 3 treated for imparting water repellency at a periphery portion of the top surface of the substrate, at a side of the substrate and at a periphery portion of the bottom surface of the substrate was simultaneously performed while edge cutting of a resist. Furthermore, then, the substrate was baked (resist post-baking) at 105° C. for 60 seconds to form a photosensitive resist layer 4. In addition, by optimizing a time duration during which Composition 11 was sprayed from a nozzle and the rotational speed of the substrate, the amount of Composition 11 to be adsorbed could be controlled and the water repellency and the adhesive strength could be adjusted.

Next, a coating solution for top coat was coated thereon by spin coating and then the resulting substrate was baked at 110° C. for 60 seconds to form a top coating layer 5.

The resulting substrate to be exposed was subjected to exposure treatment with an immersion lithography device, and consequently, as shown in FIG. 9B, there was no spill over of an immersion liquid 11 between a stage 10 and the substrate to be exposed and peeling of the edge portion of the substrate to be exposed due to convection of the immersion liquid 11 was not recognized. Thereafter, the substrate was developed with a 2.38% by mass of an aqueous tetramethylammonium hydroxide solution to complete pattern formation. Using this resist film as a mask, the film to be processed was plasma dry etched. The film to be processed was etched with respect to polysilicon in the step of forming a transistor. In any case, the resist and the lower layer organic film layer were removed by $O_2$ plasma ashing and a wet treatment using sulfuric acid and a hydrogen peroxide solution after the completion of etching. In this case, it was verified that the layer treated for imparting water repellency, which had been previously formed, was peeled off. Next, a silicon oxide film in a contact step was formed and the surface of the silicon oxide film was used as an irradiated surface and the procedure of this example was repeated to complete pattern formation of the contact step. Similarly, the procedures of a metal step and a via step were repeated to complete a semiconductor device.

In addition, in the present example, edge cutting of the resist was performed by use of the composition imparting water repellency, but the edge cutting of the resist can be performed by use of a common thinner. In this case, the layer 3 treated for imparting water repellency can be formed by the method shown in FIG. 2 after performing the edge cutting.

Further, in the present example, the layer treated for imparting water repellency was formed before resist post-baking, but the layer treated for imparting water repellency may be formed before or after resist post-baking, and when it was difficult to perform the resist post-baking or to complete a reaction with the substrate at room temperature, the layer treated for imparting water repellency may be additionally heated within the range of not adversely affecting the resist. For example, the wafer can be transferred from a spinner cup and heated at 150° C. for 60 seconds on a hot plate.

What is claimed is:

1. A water repellent composition for a substrate to be exposed, comprising at least an organosilicon compound represented by the following general formula (1) and a solvent:

in the formula, $R^1$ is a monovalent organic group having 14 to 30 carbon atoms, each $R^2$, $R^3$, and $R^4$ is independently a monovalent organic group or a hydrolyzable group having 1 to 10 carbon atoms and at least one of $R^2$, $R^3$, and $R^4$ is a hydrolyzable group.

2. The water repellent composition for a substrate to be exposed according to claim 1, further comprising at least one auxiliary selected from the group consisting of an acid and salt thereof, a base and salt thereof, and an onium compound.

3. The water repellent composition for a substrate to be exposed according to claim 2, wherein said acid is carboxylic acid having 1 to 10 carbon atoms.

4. The water repellent composition for a substrate to be exposed according to claim 1, wherein the boiling point of said solvent is 70 to 200° C.

5. The water repellent composition for a substrate to be exposed according to claim 1, wherein the proportion of said organosilicon compound in the composition is 0.01 to 6% by mass.

6. A method for forming a resist pattern by immersion lithography, comprising performing exposure through a liquid interposed between a projection optical system of an exposure device and the substrate to be exposed, wherein the method comprises exposing a substrate treated with a water repellent composition for a substrate to be exposed comprising at least an organosilicon compound represented by the following general formula (1) and a solvent:

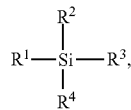
(1)

in the formula, $R^1$ is a monovalent organic group having 14 to 30 carbon atoms, each $R^2$, $R^3$, and $R^4$ is independently a monovalent organic group or a hydrolyzable group having 1 to 10 carbon atoms and at least one of $R^2$, $R^3$ and $R^4$ is a hydrolyzable group.

7. The method for forming a resist pattern according to claim 6, wherein a side of the substrate, a periphery portion of the top surface of the substrate and/or a periphery portion of the bottom surface of the substrate are treated with said composition.

8. The method for forming a resist pattern according to claim 6, wherein a side of the substrate, a whole area of the top surface of the substrate and a periphery portion of the bottom surface of the substrate are treated with said composition.

9. An electronic device produced by the method for forming a resist pattern according to any one of claims 6 to 8.

10. A treatment method for imparting water repellency to a substrate to be exposed, using a water repellent composition comprising at least an organosilicon compound represented by the following general formula (1) and a solvent:

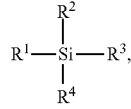
(1)

in the formula, $R^1$ is a monovalent organic group having 14 to 30 carbon atoms, each $R^2$, $R^3$, and $R^4$ each is independently a monovalent organic group or a hydrolyzable group having 1 to 10 carbon atoms, and at least one of $R^2$, $R^3$, and $R^4$ is a hydrolyzable group.

11. A water repellent set for a substrate to be exposed comprising an A solution comprising at least an organosilicon compound represented by the following general formula (1) and a solvent:

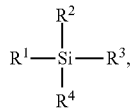
(1)

in the formula, $R^1$ is a monovalent organic group having 14 to 30 carbon atoms, each $R^2$, $R^3$, and $R^4$ is independently a monovalent organic group or a hydrolyzable group having 1 to 10 carbon atoms and at least one of $R^2$, $R^3$ and $R^4$ is a hydrolyzable group, and a B solution including at least one auxiliary selected from the group consisting of an acid and salt thereof, a base and salt thereof, and an onium compound.

12. A treatment method for imparting water repellency to a substrate to be exposed, wherein the water repellent set for a substrate to be exposed of claim 11 is used and the A solution and the B solution are mixed immediately before using the composition.

13. The water repellent composition for a substrate to be exposed according to claim 1, wherein the proportion of said organosilicon compound in the composition is 0.1 to 5% by mass.

14. The water repellent composition for a substrate to be exposed according to claim 2, wherein the auxiliary contains ammonium trifluoromethanesulfonate.

* * * * *